(12) United States Patent
Nagumo

(10) Patent No.: US 7,923,737 B2
(45) Date of Patent: Apr. 12, 2011

(54) THREE-TERMINAL SWITCH ARRAY DEVICE, COMBINED SEMICONDUCTOR DEVICE, AND IMAGE FORMING APPARATUS

(75) Inventor: Akira Nagumo, Hachioji (JP)

(73) Assignee: Oki Data Corporation, Tokyo (JP)

( * ) Notice: Subject to any disclaimer, the term of this patent is extended or adjusted under 35 U.S.C. 154(b) by 740 days.

(21) Appl. No.: 11/466,892

(22) Filed: Aug. 24, 2006

(65) Prior Publication Data
US 2007/0057259 A1    Mar. 15, 2007

(30) Foreign Application Priority Data
Sep. 14, 2005    (JP) .................................. 2005-266366

(51) Int. Cl.
H01L 29/18    (2006.01)
(52) U.S. Cl. .................... 257/88; 257/93; 257/E33.001; 438/22; 438/24; 438/46; 438/47
(58) Field of Classification Search ...................... 257/88
See application file for complete search history.

(56) References Cited

U.S. PATENT DOCUMENTS

| | | | | |
|---|---|---|---|---|
| 5,177,405 A | * | 1/1993 | Kusuda et al. | ............ 315/169.1 |
| 5,753,959 A | * | 5/1998 | Quinn et al. | ................. 257/443 |
| 6,388,695 B1 | | 5/2002 | Nagumo | |
| 2001/0040549 A1 | * | 11/2001 | Miyawaki et al. | .............. 345/99 |
| 2001/0048459 A1 | * | 12/2001 | Sakai et al. | ................... 347/233 |
| 2004/0130015 A1 | | 7/2004 | Ogihara et al. | |

FOREIGN PATENT DOCUMENTS

| | | |
|---|---|---|
| JP | 04005872 A | 1/1992 |
| JP | 8330631 A | 12/1996 |
| JP | 2000077726 A | 3/2000 |
| JP | 2000108407 A | 4/2000 |
| JP | 2004128175 A | 4/2004 |
| JP | 2004207444 A | 7/2004 |

OTHER PUBLICATIONS

Hakko Daiodo Aoki, "Light-Emitting Diodes", Kogyo Chosakai Publishing Co., Ltd., pp. 167-169, (1977).

\* cited by examiner

Primary Examiner — Ajay K Arora
(74) Attorney, Agent, or Firm — Panitch Schwarze Belisario & Nadel LLP

(57) ABSTRACT

A combined semiconductor device can be formed by bonding the thin-film three-terminal switching elements to a surface of an integrated circuit chip including a shift register that shifts data supplied to the control electrodes of the three-terminal switching elements, or by bonding both the thin-film three-terminal switching elements and another thin semiconductor film including the shift register to a substrate. In either case, thin-film wiring can be used to interconnect the shift register and the switching elements, and the need for an array of large transistors to feed driving current to the switching elements is eliminated, reducing the size and cost of the combined semiconductor device, which can be advantageously used in the optical head of an electrophotographic printer.

15 Claims, 22 Drawing Sheets

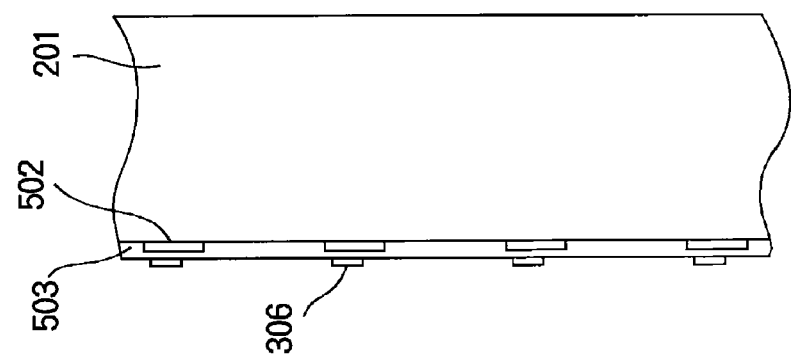
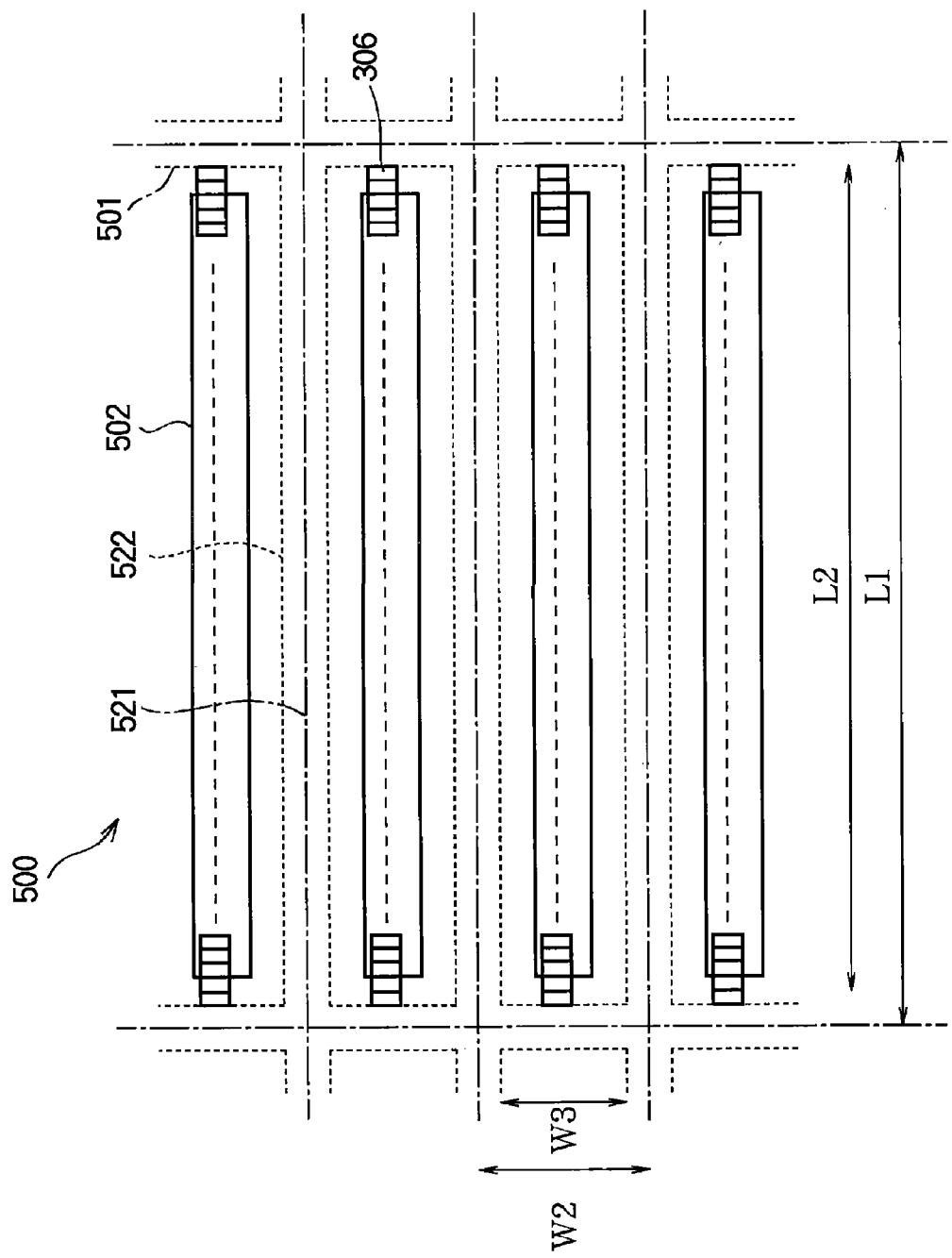

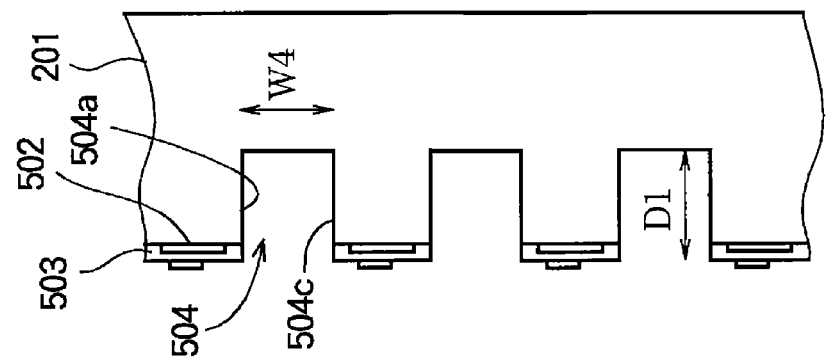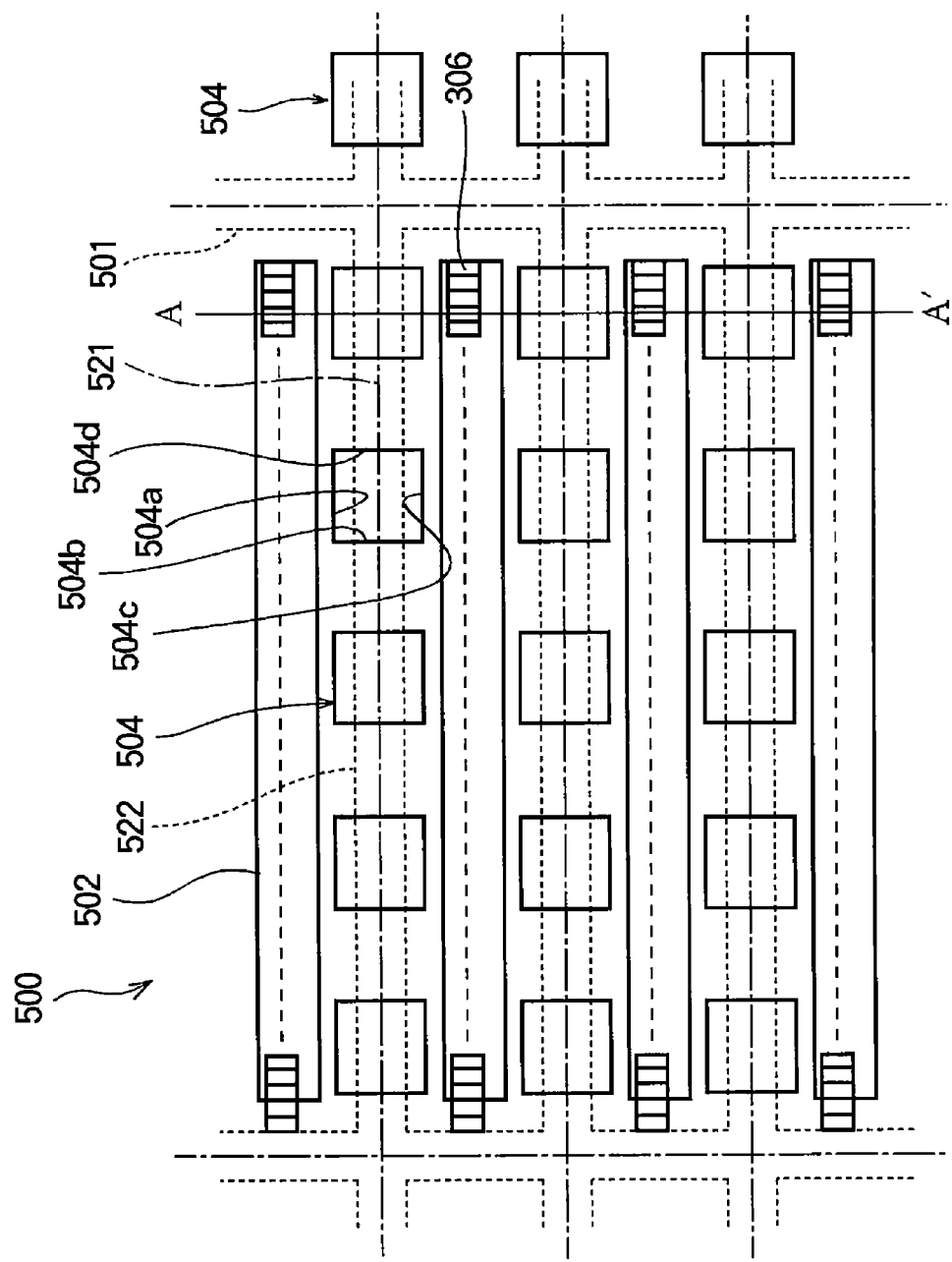
FIG.23A
FIG.23B

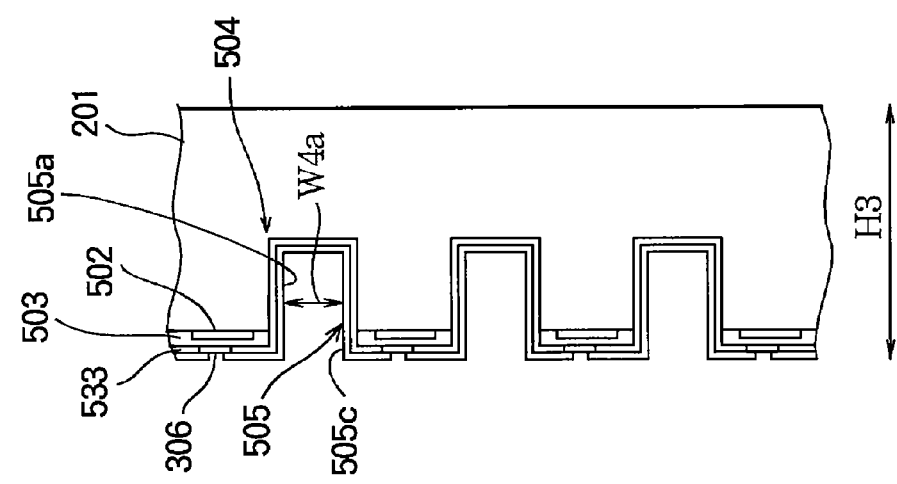
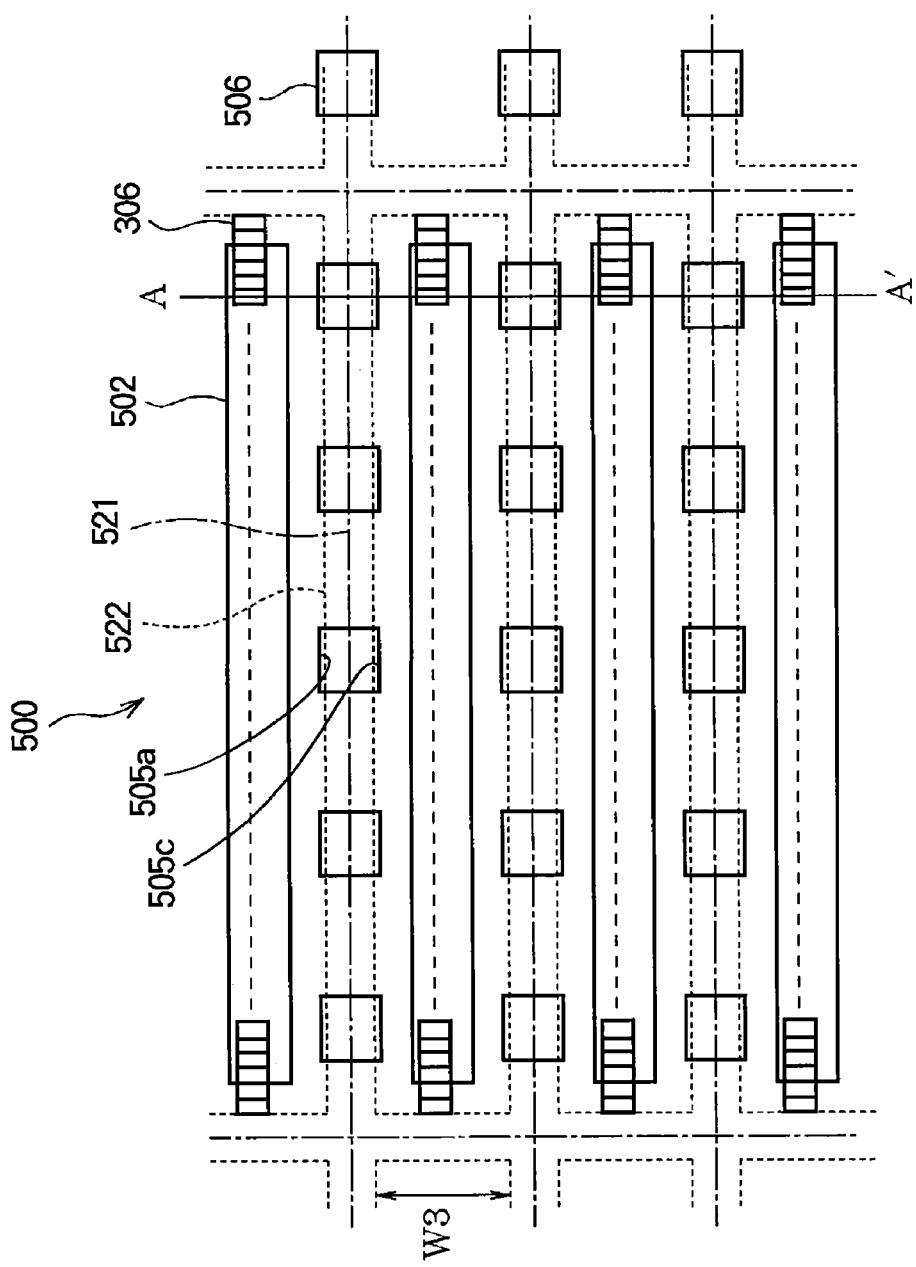
FIG. 24A
FIG. 24B

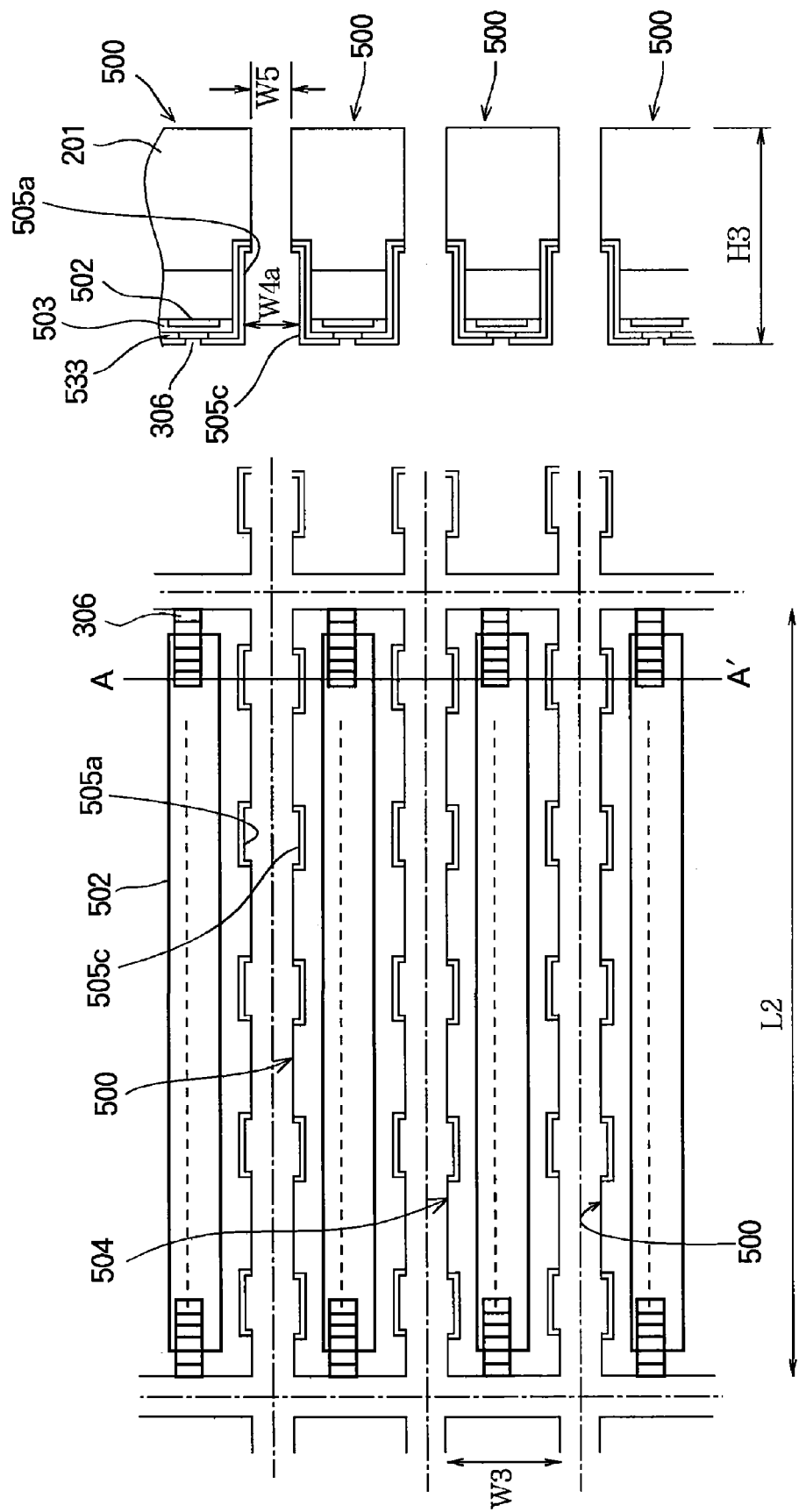

THREE-TERMINAL SWITCH ARRAY DEVICE, COMBINED SEMICONDUCTOR DEVICE, AND IMAGE FORMING APPARATUS

BACKGROUND OF THE INVENTION

1. Field of the Invention

The present invention relates to an array of three-terminal switches formed in a thin semiconductor film, such as an array of light-emitting thyristors formed in a thin compound semiconductor film; to a combined semiconductor device combining this type of thin-film array and its driving circuitry; and to an image-forming device having combined semiconductor devices of the invented type.

2. Description of the Related Art

Arrays of light-emitting elements are used as light sources in electrophotographic printers. In a conventional electrophotographic printer of this type, the light-emitting elements are light-emitting diodes (LEDs) that form an electrostatic latent image by selectively illuminating a charged photosensitive drum responsive to print data. The image is then developed by applying toner to the photosensitive drum, the toner image is transferred from the photosensitive drum onto paper, and the image is fused onto the paper by heat and pressure.

The control circuitry of an electrophotographic printer of the LED type is shown in FIG. 1. The print control unit 101, which comprises a microprocessor, read-only memory (ROM), random-access memory (RAM), input-output ports, timers, and so on disposed in the printing engine of the printer, receives a control signal SG1, a one-dimensionally mapped dot data signal referred to as a video signal SG1, and other signals from a host controller (not shown), and executes printing operations by carrying out overall sequence control of the printer. More specifically, the print control unit 101 controls a pair of drivers 102, 104 that drive respective stepper motors or pulse motors (PM) 103, 105 according to signals received from sensors 106-109, sends print data and commands to an LED head 119, controls the temperature of a fuser 122 with an internal heater 122a according to signals from a temperature sensor 123, and controls a pair of high-voltage (HV) power supplies 125, 126 that supply high negative and positive potentials, respectively, to a developer 127 and transfer unit 128.

The printing process is carried out as follows. Upon receiving a printing command in the control signal SG1, the print control unit 101 reads the fuser temperature sensor 123, and if necessary, turns on the heater 122a to raise the fuser 122 to the temperature necessary for fusing. Next, the print control unit 101 activates driver 102 to drive the development and transfer process motor 103, issues a charge signal SGC that turns on power supply 125 to charge the developer 127, and checks the paper sensor 108. If paper is present, driver 104 is activated to drive the paper transport motor 105, first in reverse to pick up a sheet of paper, then forward to bring the paper past the paper pick-up sensor 106 and into the printing mechanism of the printer. Driver 104 is controlled according to the paper size, which is sensed by the paper size sensor 109.

When the paper reaches a printable position, the print control unit 101 sends a timing signal SG3 (including a main scanning synchronization signal and a sub-scanning synchronization signal) to its host controller and begins receiving a video signal SG2 including the print data for one page. The print data are transferred to the LED head 119 a line at a time. When one line of print data has been loaded into the LED head 119, it prints the line by selectively illuminating the photosensitive drum (not shown) while receiving the print data for the next line. The photosensitive drum is negatively charged, but charge escapes from the illuminated dots. The illuminated dots are accordingly at a higher potential than the non-illuminated parts of the photosensitive drum and attract toner, which is negatively charged in the developer 127, to form a toner image.

Rotation of the photosensitive drum brings the toner image to the transfer unit 128; in the meantime, a transfer signal SG4 turns on power supply 126, which supplies a strong positive potential to the transfer unit 128. The toner image is transferred onto the paper as the paper is transported between the photosensitive drum and the transfer unit 128.

The paper carrying the transferred toner image is next transported to and pressed against the fuser 122, which has been heated by its internal heater 122a. The heat fuses the toner image onto the paper. The paper carrying the fused image passes the delivery sensor 107 and is ejected from the printing mechanism of the printer.

The print control unit 101 uses the information from the paper size sensor 109 and the paper pick-up sensor 106 to time the operation of the transfer power supply 126 so that the transfer unit 128 receives power only while paper is passing through it. When printing is completed and when the paper has passed the delivery sensor 107, the charging voltage power supply 125 stops powering the developer 127, and the development and transfer process motor 103 stops turning.

This operation is repeated for each printed page.

Next the technical background and operation of the LED head 119 will be described. An LED is one of several known types of light-emitting elements. Other examples include laser diodes and negative-resistance elements such as light-emitting thyristors and laser thyristors.

An LED has a pn or p-i-n junction formed by doping of a compound semiconductor material such as gallium arsenide (GaAs), gallium phosphide (GaP), aluminum gallium arsenide (AlGaAs), indium gallium arsenide phosphide (InGaAsP), indium gallium aluminum arsenide (InGaAlAs), etc. Carriers are injected into the junction by applying a forward voltage, and light is emitted by a carrier recombination process.

A laser diode (LD) is structured like an LED with an internal waveguide. When current exceeding a threshold level is fed through it, enough electron-hole pairs are formed to create a population inversion in which photon multiplication (light amplification) by stimulated radiation occurs, a phenomenon known as lasing. The light gains in intensity as it travels back and forth between parallel mirrors formed on, for example, the cleaved ends of the diode, repeatedly reentering the active region, and a laser beam is output from the ends of the waveguide.

A light-emitting thyristor having a pnpn structure formed by a compound semiconductor is described by Shoji Aoki in *Hakko Daiodo* (Light-Emitting Diodes), Kogyo Chosakai Publishing Co., Ltd., pp. 167-169.

As an example of the prior art, an LED head disclosed in Japanese Patent Application Publication No. 2000-108407 for printing on paper of A4 size with a resolution of 600 dots per inch will be explained with reference to FIG. 2.

The part CHP1 enclosed by the dotted line in FIG. 2 is an LED array chip including one hundred ninety-two LEDs (LED1 to LED192). The part DRV1 enclosed by the dash-dotted line is a driving IC for driving the LEDs and has drive electrodes DO1 to DO192.

The LED head 119 in FIG. 1 is an array of twenty-six identical LED array chips (CHP1 to CHP26, not shown in FIG. 1) containing one hundred ninety-two LEDs each, and twenty-six identical driving ICs (DRV1 to DRV26, not shown in FIG. 1) which are connected in cascade. FIG. 2 shows the first stage, comprising driving IC DRV1 and LED array CHP1. The other driving ICs (DRV2 to DRV26, not shown) and LED arrays (CHP2 to CHP26, not shown) are configured in the same way.

The first driving IC (DRV1) receives a load control signal (LOAD), a clock signal (CLK), four data signals (DATAI0, DATAI1, DATAI2, DATAI3), and a strobe signal (STB) from the print control unit 101 in FIG. 1 and a reference voltage VREF from a regulator circuit (not shown) in the LED head, and generates four data output signals (DATAO0, DATAO1, DATAO2, DATAO3) which are supplied to the data input terminals (DATAI0, DATAI1, DATAI2, DATAI3) of the second driver IC (DRV2, not shown). The data output terminals DATAO0-DATAO3 of driving IC DRV2 are similarly connected to the data input terminals DATAI0-DATAI3 of the third driving IC DRV3 (not shown) and so on. These interconnections are made by wire bonding and printed wiring on a printed circuit board on which the driver ICs and LED arrays are mounted. The load, strobe, and clock signals are supplied to all of the driver ICs from the print control unit 101.

The dash-dotted line in FIG. 2 encloses an internal block diagram that applies to each driving IC (DRV1 to DRV26). Flip-flop circuits FFA1 to FFA49, FFB1 to FFB49, FFC1 to FFC49, and FFD1 to FFD49 form shift-register circuits operated by the clock signal input from the CLK terminal. Latch circuits LTA1 to LTA48, LTB1 to LTB48, LTC1 to LTC48, LTD1 to LTD48 are operated by a latch signal LOAD-P (the 'P' indicates positive logic) input from the LOAD terminal.

The reference characters SEL denote a selector circuit, reference characters 131 and 132 denote inverter circuits, 133 denotes an AND gate, and 134 denotes a resistor. Reference characters MEM1 to MEM193 denote memory circuits, DR1 to DR192 denote driving circuits of the LED elements, ADJ denotes a control voltage generating circuit, and CTRL denotes a write control circuit for memories MEM1 to MEM193.

Memories MEM1 to MEM192 store dot correction data for adjusting the driving current supplied to the LEDs through LED drive terminals DO1 to DO192. The driving current is adjustable in sixteen levels. Memory MEM193 stores chip correction data for adjusting the LED driving current value of the entire driving IC in sixteen levels. These memories are provided for the following reason.

The light emitting efficiency of the LED arrays used in an LED head (and thus the amount of light emitted) generally show considerable variation both from chip to chip and from dot to dot. Because these variations in the amount of light degrade the printing quality of the printer, the driving current output by the driving ICs must be adjustable both by chip and by dot (LED) so that the variations can be corrected. Memories MEM1 to MEM192 and MEM193 store dot correction data and chip correction data used for that purpose.

Latch circuits LTA1 to LTA48 latch the data signals stored in flip-flop circuits FFA1 to FFA48. Latch circuits LTB1 to LTB48, LTC1 to LTC48, and LTD1 to LTD48 latch the data signals stored in flip-flop circuits FFB1 to FFB48, FFC1 to FFC48, and FFD1 to FFD48, respectively.

Flip-flop circuits FFA1 to FFA49 are connected in cascade. The data input terminal (D) of FFA1 is connected to data input terminal DATAI0 of the driving IC, and the data output terminal (Q) of FFA48 is connected through the selector (SEL) to data output terminal DATAO0 of the driving IC. Flip-flop circuits FFB1 to FFB48, FFC1 to FFC48, and FFD1 to FFD48 are also separately connected in cascade. The data input terminals (D) of flip-flop circuits FFB1, FFC1, and FFD1 are connected to data input terminals DATAI1, DATAI2, and DATAI3, respectively, of the driving IC, and the outputs from FFB48, FFC48, and FFD48 are respectively connected through the selector circuit (SEL) to data output terminals DATAO1, DATAO2, and DATAO3 of the driving IC.

Accordingly, flip-flop circuits FFA1 to FFA49, FFB1 to FFB49, FFC1 to FFC49, and FFD1 to FFD49 form respective forty-nine-stage shift registers. The number of shift stages of the shift register can be switched between forty-eight and forty-nine in accordance with the signal level at the LOAD terminal.

In the driving IC shown in FIG. 2, data terminals DATAI3 to DATAI0 and DATAO3 and DATAO0 are used to transfer both print data and correction data. When the correction data are transferred, the LOAD terminal is brought high to set the shift register to forty-nine-stage operation (one stage greater than in print data transfer) so that chip correction data can be transferred in addition to the dot correction data.

The outputs of the LED driving circuits DR1 to DR192 are connected to driving current output terminals DO1 to DO192 of the driving IC. Corresponding LED elements LED1 to LED192 are connected by wire bonding or by a sputtered metallization layer.

Japanese Patent Application Publication No. 2004-207444 (hereinafter, JP/2004-207444) describes another type of LED head that can be used as the LED head 119 in FIG. 1. Referring to FIG. 3, this LED head has combined semiconductor chips 200, each combining a thin-film LED array 206 and its driving circuitry. The combined semiconductor chips 200 are mounted on a glass epoxy printed circuit board 220 to which they are electrically coupled by bonding wires 221. The mounting may be effected by, for example, an insulating or a conductive adhesive paste. The thin-film LEDs 206 are fabricated as epitaxial films (epi-films) on a separate compound semiconductor substrate, then detached from that substrate and attached to the silicon substrates of the combined chips 200. The LEDs in the epi-films 206 are equally spaced in a single row, and the combined semiconductor devices 200 are mounted on the printed circuit board 220 in such a manner that the LEDs form a single equally spaced linear array extending for substantially the entire length of the LED unit 240.

Disposed also on the printed circuit board 220 are printed wiring (not shown) and bonding pads (not shown) for supplying power, data, and control signals to the combined semiconductor chips 200. The silicon substrate of each combined chip 200 has bonding pads for receiving the power, data, and control signals. The bonding wires 221 connect the bonding pads on the printed circuit board 220 to the bonding pads on the combined chips 200.

FIG. 4 is a plan view showing part of one of the combined semiconductor chips 200. FIG. 5 is a sectional view through line A1-A1' line in FIG. 4. FIG. 6 is a sectional view through line A2-A2' line in FIG. 4.

As shown in FIGS. 4 to 6, the combined chip 200 has a monolithic silicon substrate 201 in which an integrated circuit 202 is formed, a first interlayer dielectric film 203 formed on the silicon substrate 201, an adhesive layer 204 formed mainly from a semiconductor material on the interlayer dielectric film 203, and a ground plane 205 formed on the adhesive layer 204. The thickness of the silicon substrate 201 is, for example, about 300 μm.

The combined chip 200 includes a plurality of LED epitaxial films or epi-films 206, which were shown schematically as a single film in FIG. 3. The LED epi-films 206 are bonded onto the ground plane 205. A discrete electrode 207 extends from each LED epi-film 206 to a discrete terminal area 208 of the integrated circuit 202 to electrically connect the LED epi-film 206 and the integrated circuit 202. A second interlayer dielectric film 209 (FIG. 6) for electrically insulating the discrete electrodes 207 from part of the silicon substrate 201 and the LED epi-films 206 is disposed where insulation is needed, such as between the discrete electrode layer and the ground plane 205 and between the discrete electrode layer and the adhesive layer 204.

Each of the LED epi-films 206 has an appropriate semiconductor multilayer structure such as a hetero-epitaxial layer structure so that it functions as an LED. As shown in FIG. 4, the LED epi-films 206 are arranged at equal intervals the linear array.

The LED epi-film 206 has a thickness of about 2 μm, which is adequate for providing stable light-emitting and electrical properties.

The integrated circuit 202 formed in the silicon substrate 201 has substantially the same circuit configuration as DRV1 in FIG. 2. The driving circuits (DR1 . . . ) are disposed facing the LED epi-films 206 that they drive.

The integrated circuit 202 is formed in the upper part of the silicon substrate 201, within the dotted line in FIG. 5. As in FIG. 2, the integrated circuit 202 contains numerous memory elements and other types of circuit elements. To accommodate these circuit elements, the width W of the silicon substrate 201 greatly exceeds the width W1 of the epi-film.

The first interlayer dielectric film 203 shown in FIG. 5 can be a single-layer or multilayer structure containing at least either a silicon-oxide ($SiO_2$) layer or a silicon-nitride ($Si_3N_4$) layer. The first interlayer dielectric film 203 electrically insulates the surface of the silicon substrate 201 from the LED epi-films 206, so that the LED epi-films 206 can function normally. The interlayer dielectric film 203 and the integrated circuit 202 occupy separate but adjacent surface areas of the silicon substrate 201.

The adhesive layer 204 is a semiconductor layer such as a polycrystalline silicon layer or an amorphous silicon layer formed by chemical vapor deposition (CVD). The adhesive layer 204 has high affinity for the interlayer dielectric film 203, and provides a high adhesion strength between the adhesive layer 204 and the first interlayer dielectric film 203.

The ground plane 205 may be a metal layer of a material such as gold or palladium. The adhesive layer 204 also has high affinity for the ground plane 205, providing high adhesion strength between the adhesive layer 204 and the ground plane 205. The LED epi-films 206 are affixed to the surface of the ground plane 205.

The ground plane 205 both holds the LED epi-films 206 firmly attached and connects them electrically to a common terminal (such as a ground pad) located on the silicon substrate 201. An ohmic contact is preferably formed between the ground plane 205 and the lower surfaces of LED epi-films 206. The ground plane 205 can be electrically connected to the common (e.g. ground) terminal area by wiring 332 as in FIG. 11, or through an opening (not shown) in the first interlayer dielectric film 203.

The ground plane 205 is electrically connected to each LED epi-film 206 through the entire under-surface of the LED epi-film 206, more specifically, through the entire surface of the n-type GaAs layer 211 shown in FIG. 6, which functions as a cathode electrode (n-electrode). The common terminal area on the silicon substrate 201 is a common return terminal for the driving current supplied to drive the LEDs.

As shown in FIG. 6, the combined chip 200 has a multilayer structure including the silicon substrate 201, the first interlayer dielectric film 203, the adhesive layer 204, the ground plane 205, the LED epi-films 206, the second interlayer dielectric film 209, and the discrete electrode layer 207, in that order. Each LED epi-film 206 has a multilayer structure including an n-type GaAs contact layer 211, an n-type $Al_xGa_{1-x}As$ lower cladding layer 212 ($0 \leq x \leq 1$), an n-type $Al_yGa_{1-y}As$ active layer 213 ($0 \leq y \leq 1$), an n-type $Al_zGa_{1-z}As$ upper cladding layer 214 ($0 \leq z \leq 1$), and a p-type GaAs contact layer 215 formed in that order. A p-type zinc diffusion region 216 is formed in the n-type $Al_yGa_{1-y}As$ layer 213 and the n-type $Al_zGa_{1-z}As$ layer 214 beneath the p-type GaAs layer 215.

The n-type GaAs layer 211 has a thickness of about 10 nm (=0.01 μm). The n-type $Al_xGa_{1-x}As$ layer 212 has a thickness of about 0.5 μm. The n-type $Al_yGa_{1-y}As$ layer 213 has a thickness of about 1 μm. The n-type $Al_zGa_{1-z}As$ layer 214 has a thickness of about 0.5 μm. The GaAs layer 215 has a thickness of about 10 nm (=0.01 μm). The LED epi-film 206 accordingly has, in this case, a thickness of about 2 μm.

A process for fabricating the LED epi-film 206 will next be described with reference to the sectional views in FIGS. 7 and 8.

In FIG. 7, an LED epitaxial layer 206a, which will be partially removed to form LED epi-films 206, is grown by a process such as metal organic chemical vapor deposition (MOCVD) or molecular beam epitaxy (MBE). First a GaAs buffer layer 222, an (AlGa)InP etching stop layer 223, and an AlAs separation layer 224 are deposited in succession on a GaAs substrate 221. The GaAs substrate 221, GaAs buffer layer 222, and (AlGa)InP etching stop layer 223 form an LED epi-film fabrication substrate 324. Then the lower contact layer (n-type GaAs layer) 211, lower cladding layer (n-type $Al_xGa_{1-x}As$ layer) 212, active layer (n-type $Al_yGa_{1-y}As$ layer) 213, upper cladding layer (n-type $Al_zGa_{1-z}As$ layer) 214, and upper contact layer 215 (at this stage an n-type GaAs layer 215) are deposited on the AlAs separation layer 224 in this order.

The LED epitaxial layer 206a is now removed by chemical lift-off. First, the GaAs layers 211 to 215 are etched to form trenches, one of which is shown in FIG. 8. The trenches 225 are formed by photolithography using, for example, a resist mask patterned to define the trench areas and an etching solution of phosphoric acid and hydrogen peroxide. The solution of phosphoric acid and hydrogen peroxide readily etches the GaAs and AlGaAs layers 211 to 215, but the etching rate of (AlGa)InP is slow, so that trench formation stops at the (AlGa)InP etching stop layer 223 and does not proceed into the GaAs buffer layer 222 of the fabrication substrate 324.

After the trenches 225 are formed, the AlAs separation layer 224 is etched with a 10% hydrofluoric acid (HF) solution. Because the HF etching rate of the AlAs separation layer 224 is much higher than the HF etching rate of the GaAs, AlGaAs, and (AlGa)InP layers 211 to 215 and 221 to 223, the AlAs separation layer 224 can be etched selectively, leaving the LED epi-films 206 substantially intact but detaching them from the LED epi-film fabrication substrate 324. FIG. 8 shows an intermediate stage in which the LED epi-films are still partly attached to the fabrication substrate 324 by the AlAs separation layer 224. When the etching process is completed, the AlAs separation layer 224 is completely removed and the LED epi-films 206 are held from above in, for example, the manner described below.

Before the LED epi-films 206 are removed, supporting members may be formed on their surfaces for support and protection. If such supporting members are formed on the LED epi-films 206, the surfaces of the supporting members can be held by a vacuum holding tool, or by a photocurable adhesive sheet of the type that loses its adhesion by exposure to light, for easy transportation.

The LED epi-films 206 are transported from the fabrication substrate 324 to a silicon wafer that constitutes the silicon substrate 201 of the compound semiconductor chips 200. The second interlayer dielectric film 209 is deposited on the wafer surface and patterned by photolithography to form a mask for the zinc diffusion process, which is now carried out to form the diffusion regions 216 shown in FIG. 6, thereby creating the LEDs. Performing the zinc diffusion process on the silicon wafer substrate ensures that the LEDs in each compound semiconductor chip 200 are evenly spaced. Next, a layer of metal is deposited and patterned to form the discrete electrodes 207 and other necessary interconnection wiring, after which wafer is diced into chips.

FIG. 9 is a schematic sectional view of a conventional LED head 119 employing combined semiconductor chips 200 of the conventional type described above. The printed circuit board 220 that was shown in FIG. 3 rests on a base 231. The LED head 119 also has a rod lens array 232 including a large number of cylindrical optical elements, a holder 233 for holding the rod lens array 232, and a clamp 234 for fastening the base 231, rod lens array 232, and holder 233 together. Light emitted by the combined semiconductor chips 200 passes through the rod lens array 232 and illuminates the photosensitive drum (not shown) in a printer. The width W0 of the LED head 119 must be adequate to accommodate the width of the combined semiconductor chips 200 and the bonding pads and wires (not shown) that connect them electrically to the printed circuit board 220.

For reasons that will now be explained, it has proven difficult to reduce the size and cost of the LED head as much as would be desirable.

In the conventional scheme illustrated in FIG. 2, with separate LED array chips and driver chips, the cost of wire bonding and the size of the LED array chips and driver chips are major factors that drive up the cost of the LED head. In particular, the material cost of the compound semiconductor LED array chips is high. One factor in the comparatively large size of the LED array chips and driver chips is the large number of space-consuming bonding pads needed to interconnect them. Another factor is the large size of the transistors in the drivers (DR1 . . . in FIG. 2) that drive the LEDs. The large size of the driving transistors is dictated by the need to supply the current consumed by the LEDs in generating light. Yet another factor is the need for memory elements (MEM1 . . . in FIG. 2) to store correction data.

If the LEDs are formed in epi-films disposed on the driving ICs, as FIGS. 3-9, compound semiconductor material costs and wire-bonding costs can be reduced, but the problem of the size of the driving circuits and the need to store correction data still remains. The conventional LED head disclosed in JP/2004-207444 permits the use of various compound semiconductor materials, such as GaAs, GaP, AlGaAs, InGaAsP, and InGaAlAs, for the light-emitting elements, but whichever of these materials are used, the light-emitting elements inevitably differ in their light-emitting characteristics because of crystal lattice defects etc. Compensation for variation in light-emitting efficiency is essential if printed output of high quality is to be obtained.

A further problem is that, because some of the compound semiconductor processing steps that form the LEDs, such as p-type impurity diffusion, are performed after the LED epi-films have been attached to the silicon wafer substrate, and because wiring must be formed in this state, diffusion and wiring defects can render both an LED array and its driving circuit useless. Consequently, the yield of combined semiconductor chips per wafer is lower than the yield when the LED array chips and driver ICs are fabricated separately.

Another problem is that, although the conventional configuration as disclosed in JP/2004-207444 lowers the compound semiconductor material cost, additional fabrication steps are required, so that the cost of the semiconductor fabrication process becomes an obstacle to reducing the cost of the LED head.

SUMMARY OF THE INVENTION

An object of the present invention is accordingly to reduce the size of a combined semiconductor device including an array of semiconductor elements and their driving circuitry.

A further object is to reduce the cost of such a combined semiconductor device.

The invention provides a three-terminal switch array including a plurality of three-terminal switching elements formed in a thin semiconductor film, each switching element having a control electrode receiving an external control signal.

The three-terminal switching elements may be, for example, light-emitting thyristors. An advantage of such an array is that combining the light-emitting functions and switching functions into the same element eliminates the need for large separate switching elements to switch current through the light-emitting elements on and off, and provides additional design freedom when the three-terminal switch array is used in combination with other circuitry.

The invention also provides a three-terminal switch array device including the above three-terminal switch array and a shift register. The control terminals of the three-terminal switching elements are connected to respective output terminals of the shift register. The other two terminals of each three-terminal switching element are connected to a driver and ground.

An advantage of this scheme is a single driver can feed current to all of the three-terminal switching elements. The shift register stores data that switch the individual switching three-terminal elements on and off.

The invention also provides a combined semiconductor device including the above three-terminal switch array and shift register, a driving controller, a ground terminal, thin-film wiring that interconnects the three-terminal switch array and shift register, thin-film wiring that connects the three-terminal switching elements to the driving controller, and thin-film wiring that interconnects the three-terminal switching elements to ground. The three-terminal switching elements are light-emitting elements. The driving controller supplies driving current to the three-terminal switching elements in synchronization with output of logic signals from the shift register.

Use of thin-film wiring makes the combined semiconductor device easier and less expensive to manufacture than conventional devices employing wire bonding.

In the above combined semiconductor device, the shift register may be formed in a substrate to which the three-terminal switch array is bonded. An advantage is that the substrate and the thin film in which the three-terminal switch array is disposed may employ different semiconductor materials. Alternatively, the three-terminal switch array and the shift register may be formed in separate thin films, both of which are bonded to a substrate, an advantage being that the substrate need not be a semiconductor substrate.

The invention also provides a combined semiconductor device comprising a semiconductor chip formed from a first material, a light-emitting semiconductor device formed from a thin film of a second material which is bonded to a first surface of the semiconductor chip, circuitry connected to the light-emitting semiconductor device, and bonding pads formed on a second surface of the semiconductor chip, connected to the light-emitting semiconductor device and the circuitry. The first and second surfaces are mutually orthogonal; for example, the second surface may be a major surface and the first surface an edge surface. An advantage of this configuration is that the surface area of the chip can be reduced.

The invention also provides a light-emitting element head comprising a plurality of three-terminal switch arrays, three terminal switch array devices, or combined semiconductor devices of any of the types above, and an image forming apparatus employing the light-emitting element head.

BRIEF DESCRIPTION OF THE DRAWINGS

In the attached drawings:

FIGS. 22A, 23A, 24A, and 25A are plan views illustrating steps of the fabrication of combined semiconductor devices according to the third embodiment;

FIGS. 22B, 23B, 24B, and 25B are sectional drawings corresponding to the plan views in FIGS. 22A, 23A, 24A, and 25A;

DETAILED DESCRIPTION OF THE INVENTION

Figure 1:
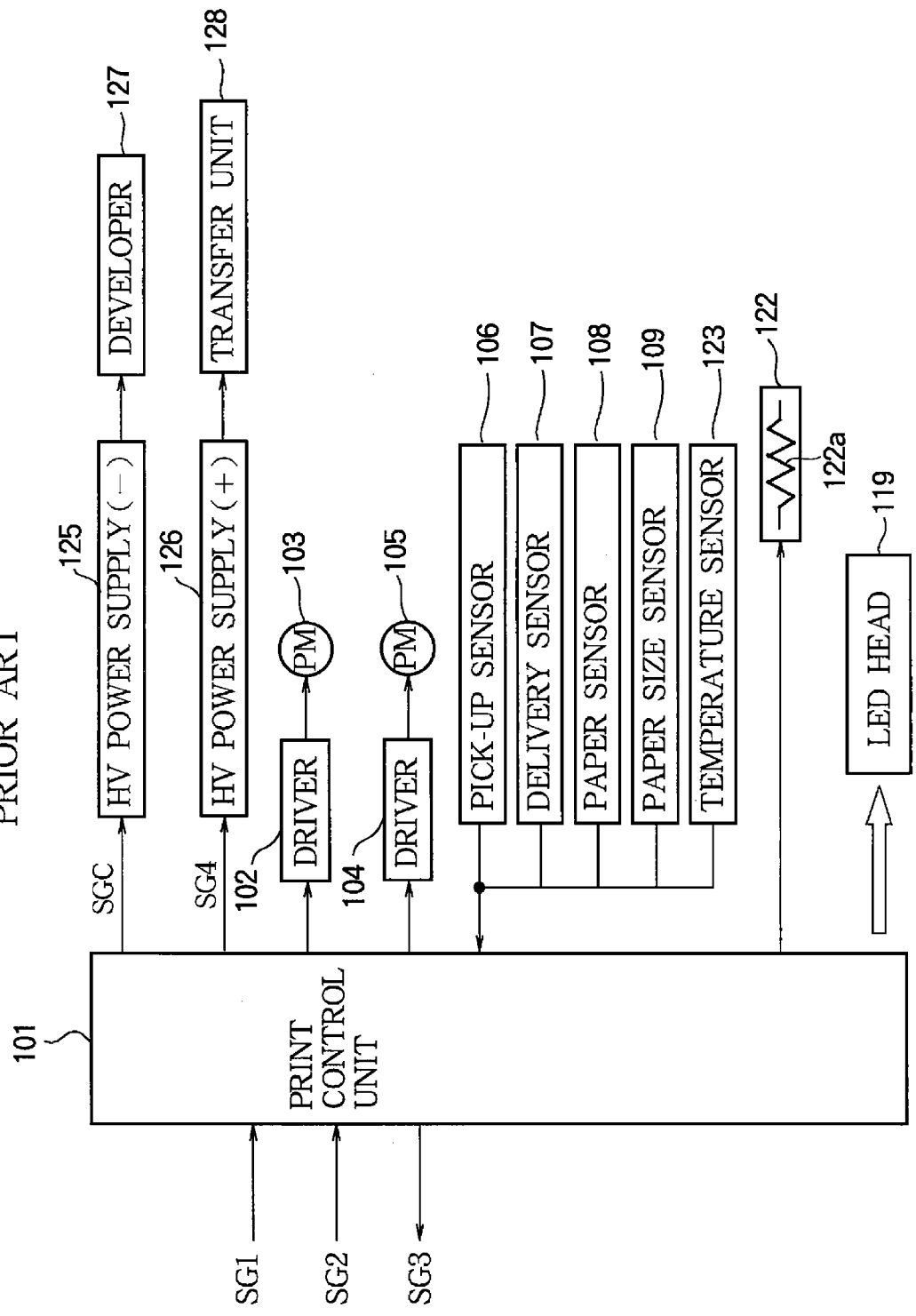
FIG. 1 is a block diagram of a printer control circuit in a conventional electrophotographic printer.

Embodiments of the invention will now be described with reference to the attached drawings, in which like elements are indicated by like reference characters.

First Embodiment

Figure 10:
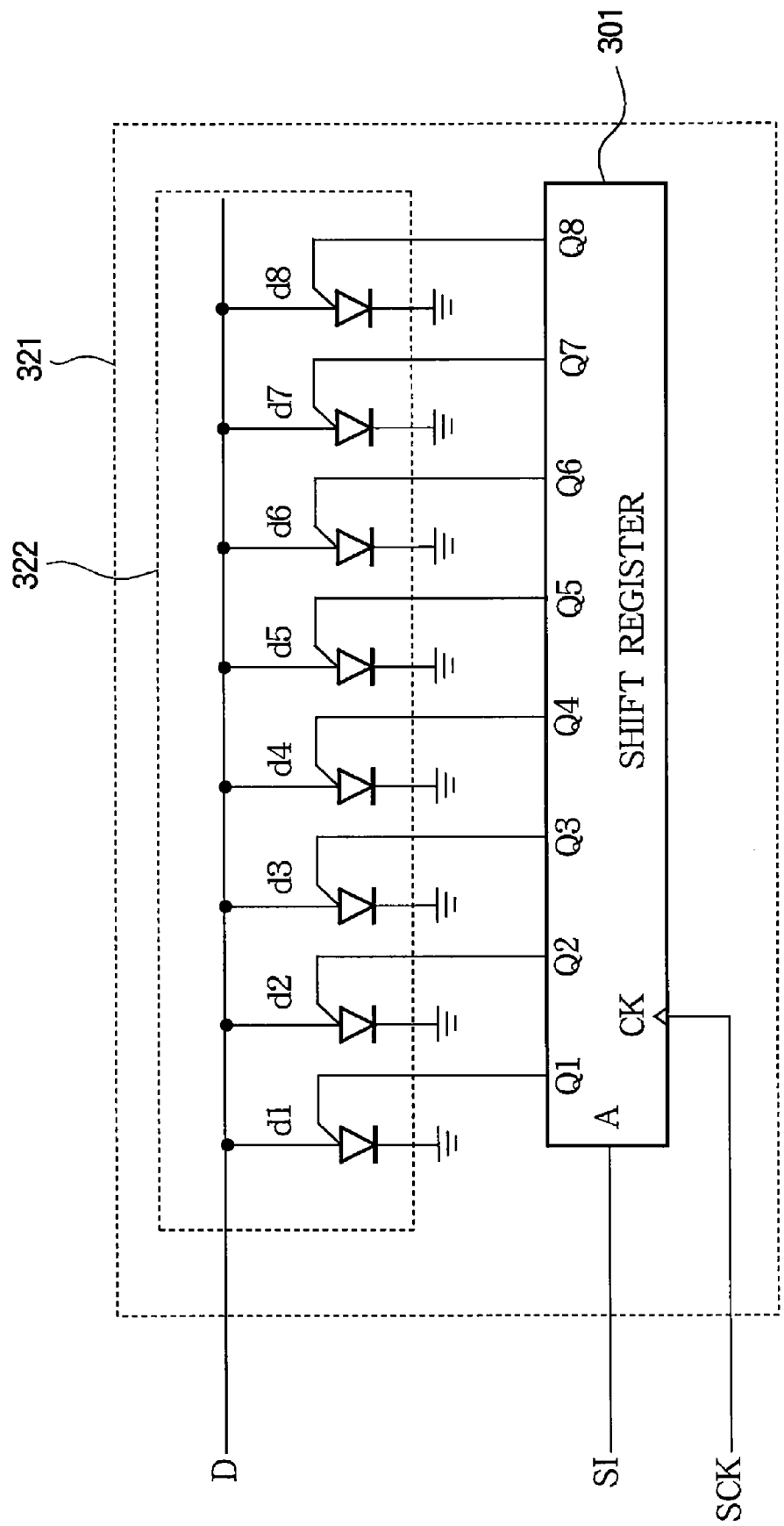
FIG. 10 is a schematic circuit diagram of a combined semiconductor device in a first embodiment of the invention.

Referring to FIG. 10, the first embodiment of the invention is a three-terminal switch array device including a row of three-terminal switching elements d1-d8. The number of three-terminal switching elements is not limited to the eight shown. The three-terminal switching elements may be light-emitting thyristors, in which case the array will be referred to as a light-emitting thyristor array. A light-emitting thyristor array with one hundred ninety-two light-emitting thyristors instead of eight can be used to replace, for example, the LED array CHP1 in FIG. 2.

The three-terminal switching elements d1-d8 are formed from a thin film and are attached to a substrate 321 in a rectangular area 322. All of the three-terminal switching elements may be formed in a single thin film, or the three-terminal switching elements d1-d8 may be formed in separate thin films and attached individually to the substrate 321. Alternatively, the three-terminal switching elements may be disposed in several thin films, each including a plurality of three-terminal switching elements. In a light-emitting thyristor array for an electrophotographic printer, each thin film might include eight light-emitting thyristors, for example, or sixty-four light-emitting thyristors.

Figure 2:
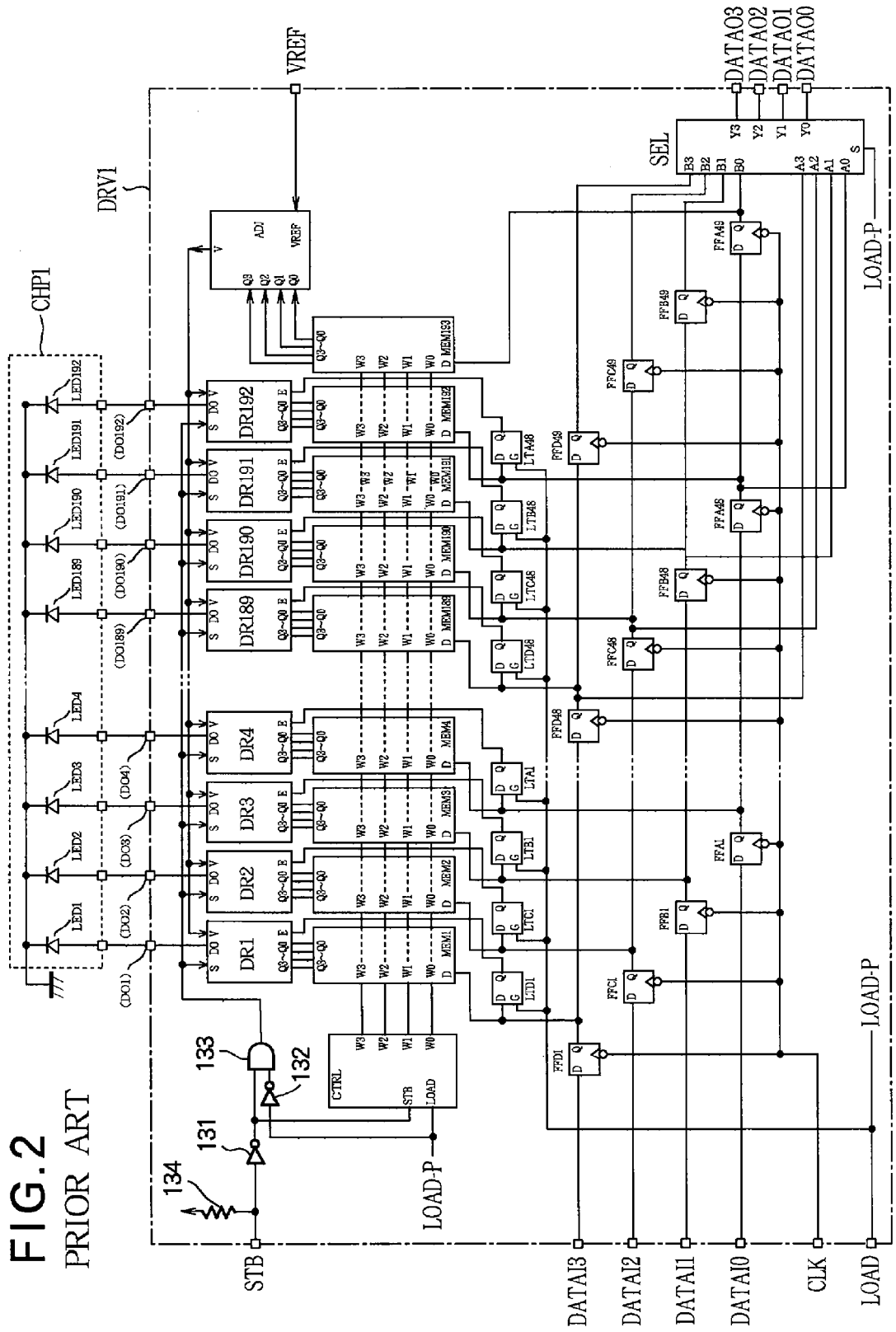
FIG. 2 is a schematic circuit diagram of a conventional LED head.

Adjacent and parallel to the area 322 in which the three-terminal switching elements d1-d8 are attached, a shift register 301 comprising flip-flop circuits similar to the flip-flop circuits FFA1, FFA2, . . . shown in FIG. 2 is formed in or attached to the substrate 321.

The three-terminal switching elements d1-d8 have grounded cathode terminals, anode terminals that are mutually interconnected and receive an externally supplied data signal D, and control terminals that are connected to output terminals Q1-Q8 of the shift register 301. The shift register 301 also has a data input terminal A that receives an externally supplied shift-in signal SI, and a clock terminal CK that receives an externally supplied shift clock signal SCK.

In general, if there are N three-terminal switching elements in the array (where N is an integer not less than two), the shift register has N outputs, the control electrode of the n-th switching element (where n is an integer from 1 to N) is connected to the n-th output of the shift register, and the n-th output of the shift register outputs a logic signal to the control electrode of the switching element.

In an electrophotographic printer, these interconnections enable the three-terminal switch array device to be driven by using the data signal D to supply print data and using the shift register 301 to scan the light-emitting elements d1-d8 one at a time. Details will be shown later. Because of this driving scheme, the shift register 301, which only has to output control logic signals, has comparatively small output transistors (not shown).

Figure 11:
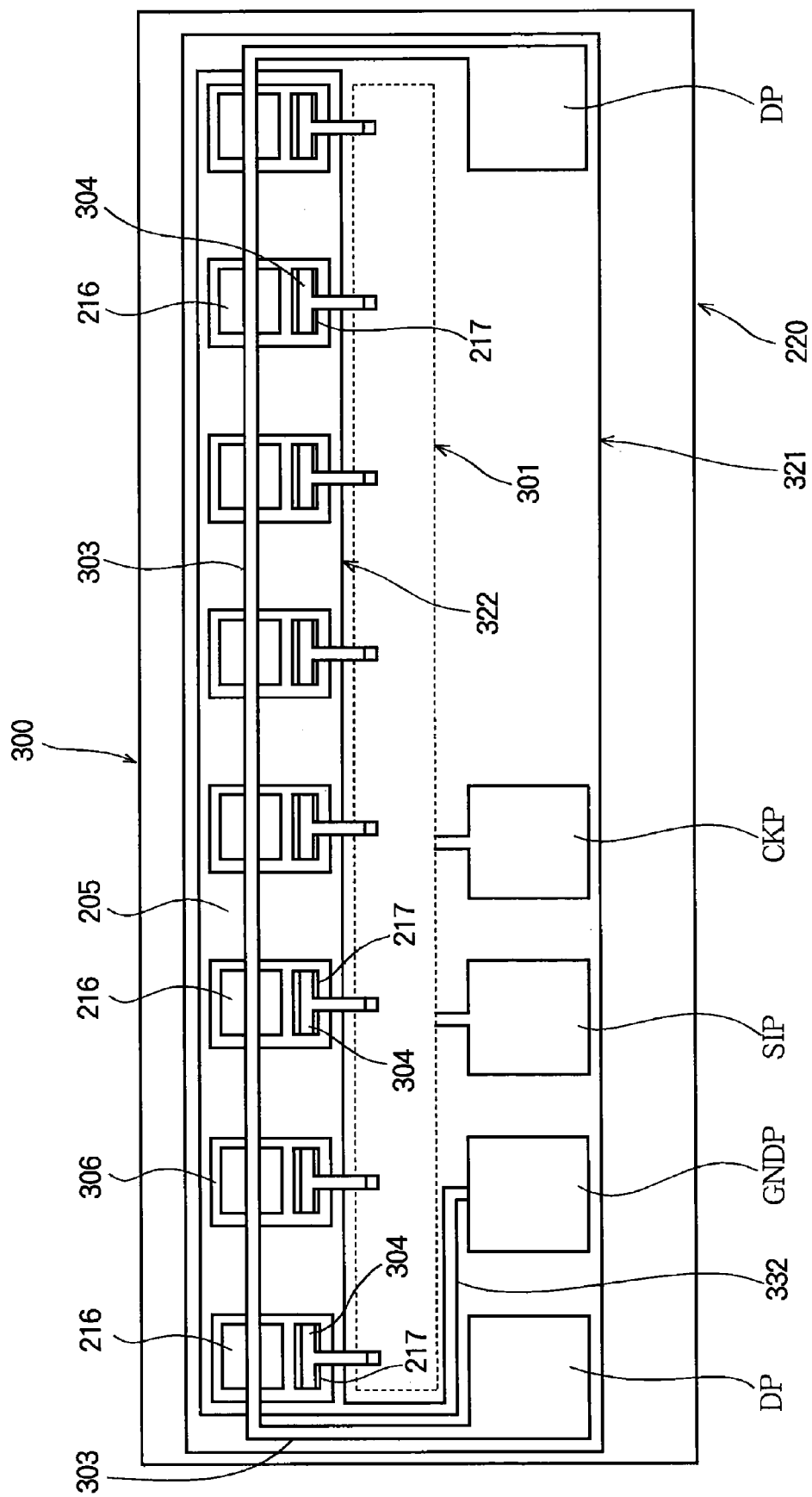
FIG. 11 is an exemplary plan view of the combined semiconductor devices in FIG. 10.

FIG. 11 shows an example in which the substrate 321 is a silicon (Si) semiconductor substrate and the shift register 301 is integrated into one of its major surfaces, making the three-terminal switch array a combined semiconductor device 300. The three-terminal switching elements 306 are light-emitting thyristors formed in a compound semiconductor epitaxial film on a separate compound semiconductor fabrication substrate, from which they are detached and then reattached to the silicon substrate 321 in the area 322 adjacent and parallel to the shift register 301. In this example, each light-emitting thyristor is formed as a separate thin compound semiconductor film, which will be referred to below as a thyristor epi-film 306.

The thyristor epi-films 306 have a partly vertical and partly lateral pnpn structure in which the first p-type component (the anode) is a p-type zinc diffusion region 216 and the first n-type component is partly exposed to form a control electrode or gate electrode 217. The second n-type component at the bottom of the epi-film (not shown) forms the cathode electrode. The thyristor is switched on by a forward voltage applied simultaneously between its anode and cathode and between its anode and gate electrode, and is switched off by removing the forward voltage.

The zinc diffusion areas 216 are interconnected by a common anode electrode line 303. Each gate electrode 217 is connected by a separate gate electrode line 304 to the shift register 301. The electrode lines 303 and 304 are formed from a thin film of a material such as gold or a gold alloy by well-known photolithographic techniques such as lift-off. The undersurfaces of the light-emitting thyristors 306, which function as the cathode electrodes, are connected to a conductive ground plane 205 on which the light-emitting thyristors 306 are disposed. The ground plane 205 is also a thin film patterned by photolithography.

The anode electrode line 303 terminates at each end in a bonding pad DP for the data signal D. When a plurality of combined semiconductor devices 300 are used to form a thyristor unit, it is useful to have bonding pads DP at both ends of the silicon substrate 321, so that the bonding pads DP at adjacent ends of a mutually adjacent pair of combined semiconductor devices 300 can be directly interconnected by a bonding wire to conduct the data signal D from one device to the next.

Another bonding pad SIP receives the shift-in signal SI and corresponds to the shift-in terminal A in FIG. 10. The combined semiconductor device 300 also has a bonding pad CKP (corresponding to the CK terminal in FIG. 10) for receiving the shift clock signal SCK and a ground bonding pad GNDP connected by thin-film wiring 332 to the ground plane 205. These bonding pads CKP and GNDP are connected by bonding wires (not shown) to bonding pads on a printed circuit board 220 on which the combined semiconductor device 300 is mounted. When a plurality of combined semiconductor devices 300 are mounted on the printed circuit board 220 and interconnected in series by their DP bonding pads, the DP bonding pad at one end of the series connection is also connected by a bonding wire to a bonding pad on the printed circuit board to receive the data signal D from an external source.

Other bonding pads (not shown) may be provided as necessary, e.g., to supply power to the shift register 301 and receive a shift-out signal from the shift register.

Figure 12:
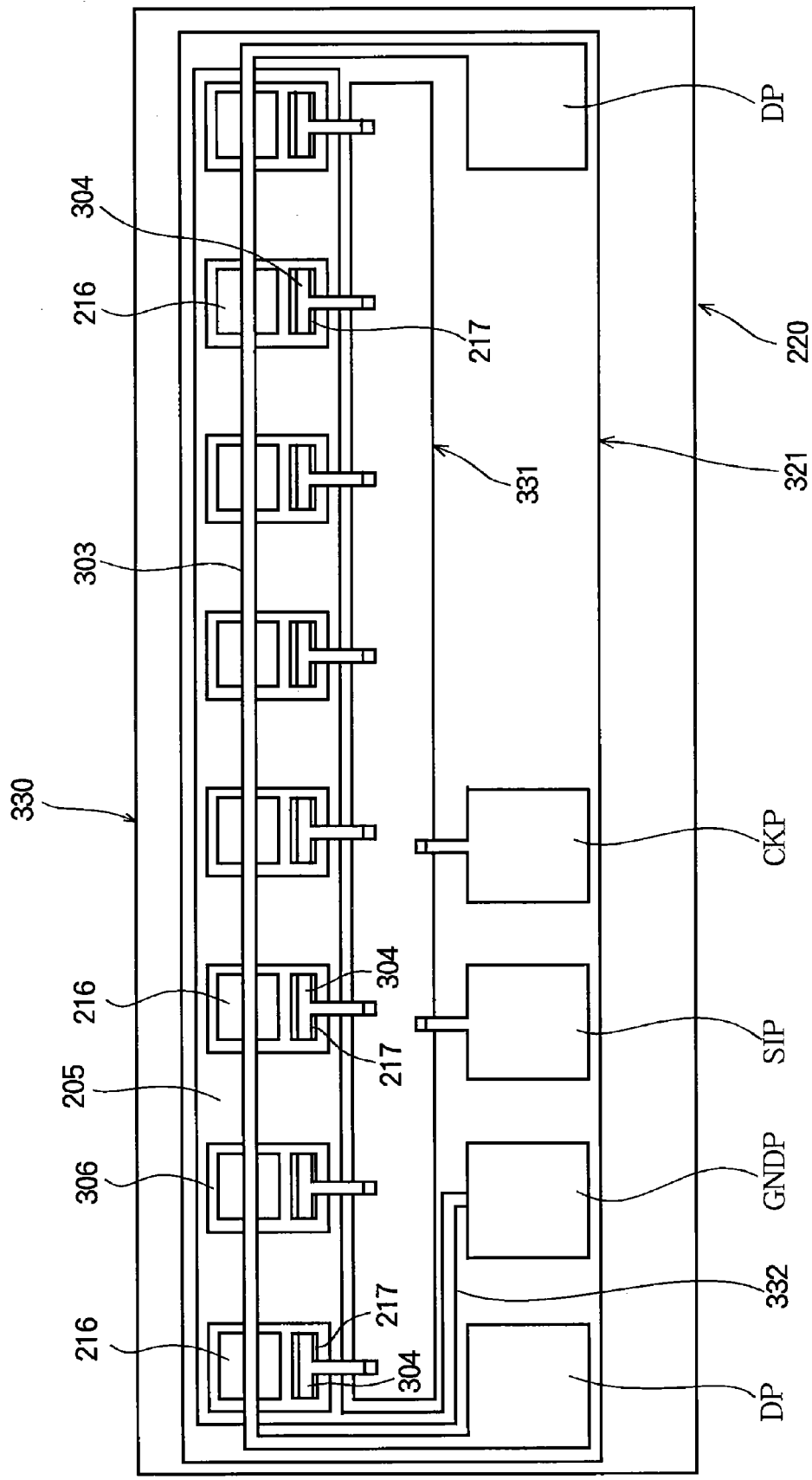
FIG. 12 is another exemplary plan view of the combined semiconductor device in FIG. 10.

FIG. 12 shows another example in which the substrate 321 is a glass or ceramic substrate, or a metal substrate with an insulated surface, and the shift register 301 is integrated into a thin polysilicon film or a thin organic semiconductor film 331 attached to the substrate 321. The combined semiconductor device 330 includes the substrate 321, the shift register film 331, and the same bonding pads, interconnecting lines, and light-emitting thyristors as in FIG. 11, indicated by the same reference numerals.

Figure 7:
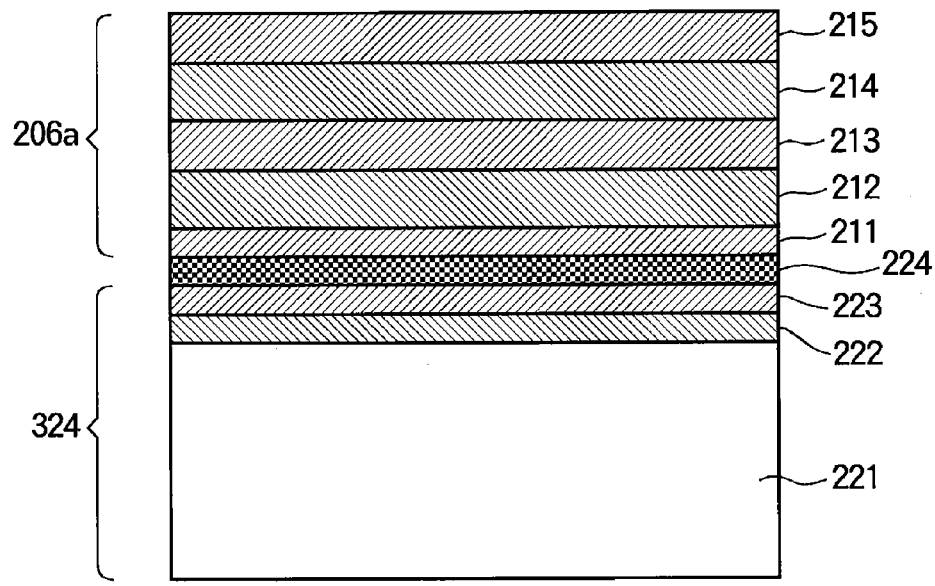
FIG. 7 is a schematic sectional view illustrating a step in the fabrication of the LED epi-film shown in FIGS. 4 to 6.
Figure 8:
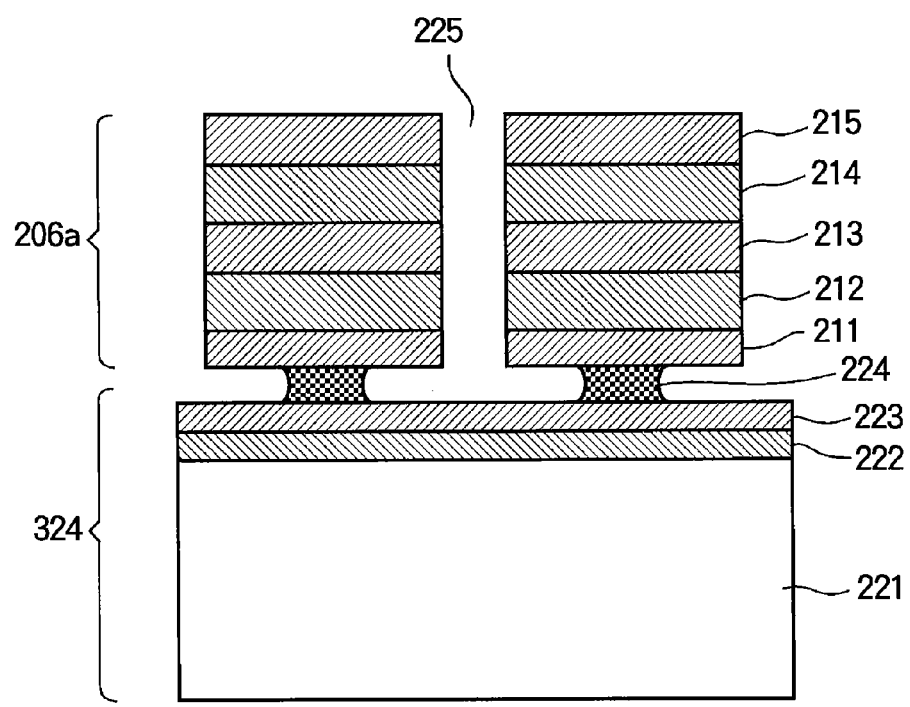
FIG. 8 is a schematic sectional view showing a subsequent step in the fabrication of the LED epi-film shown in FIGS. 4 to 6.

A process for fabricating thin films including light-emitting thyristors will now be described with reference to FIGS. 13 to 15. This process is similar to the conventional process shown in FIGS. 7 and 8 for forming LED epi-films, but inserts an additional p-type GaAs layer between the n-type lower cladding layer and the n-type lower contact layer to create an npn structure, which is later modified by a zinc diffusion to create a pnpn structure. The thin films will again be referred to as thyristor epi-films.

Figure 13:
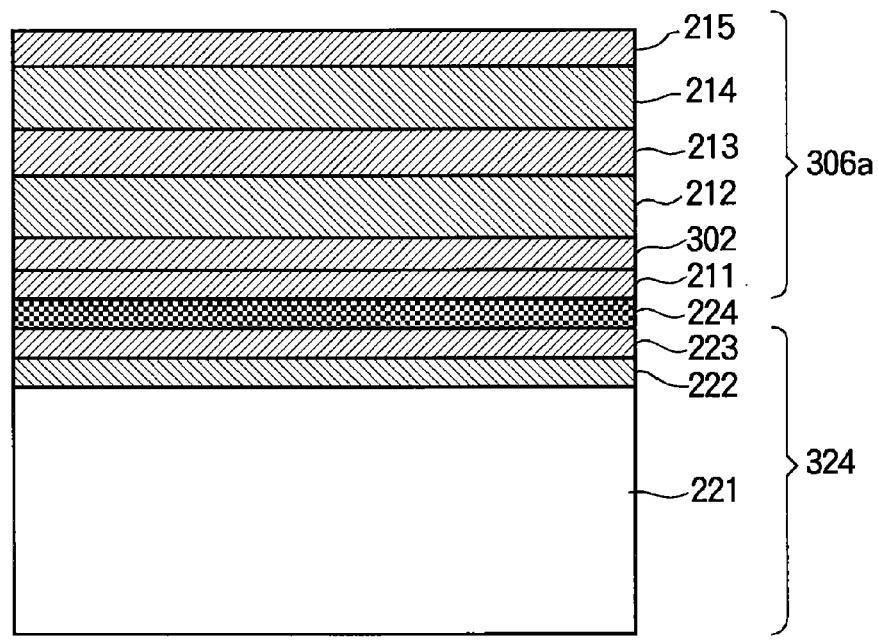
FIG. 13 is a schematic sectional view illustrating a step in the fabrication of a thyristor epi-film.

Referring to FIG. 13, first a GaAs buffer layer 222, an (AlGa)InP etching stop layer 223, and an AlAs separation layer 224 are formed in this order on a GaAs substrate or wafer 221. The GaAs substrate 221, GaAs buffer layer 222, and (AlGa)InP etching stop layer 223 constitute a fabrication substrate 324. Next, a GaAs contact layer or cathode layer (n-type GaAs layer) 211, a p-type GaAs layer 302, an AlGaAs lower cladding layer (n-type $Al_xGa_{1-x}As$ layer) 212, an AlGaAs active layer (n-type $Al_yGa_{1-y}As$ layer) 213, an AlGaAs upper cladding layer (n-type $Al_zGa_{1-z}As$ layer) 214, and another GaAs contact layer or anode layer (n-type GaAs layer 215) are formed in this order on the AlAs separation layer 224. The GaAs contact layer 211, p-type GaAs layer 302, AlGaAs lower cladding layer 212, AlGaAs active layer 213, AlGaAs upper cladding layer 214, and GaAs layer 215 constitute a thyristor epitaxial layer 306a. The above layers may be formed by a process such as metal organic chemical vapor deposition (MOCVD) or molecular beam epitaxy (MBE). The (AlGa) InP etching stop layer 223 may be omitted if not needed.

After the multilayer structure shown in FIG. 13 has been formed, the thyristor epitaxial layer 306a is removed from the fabrication substrate 324. The removal can be effected by chemical lift-off, which will be described with reference to FIG. 14.

Figure 14:
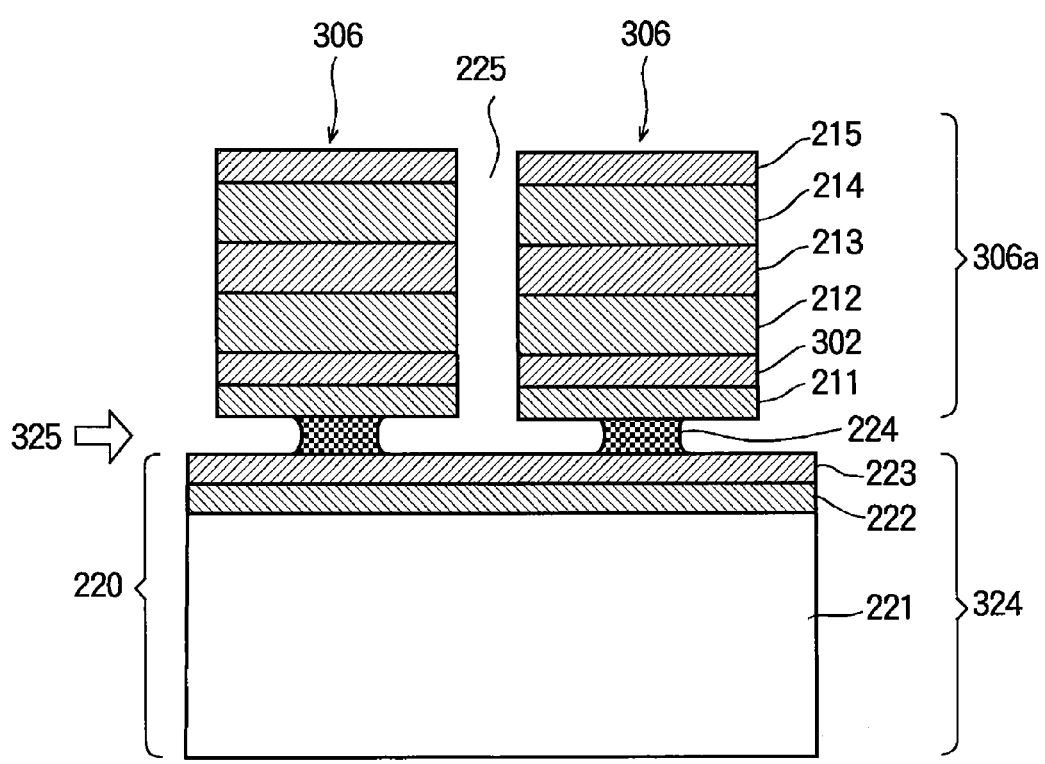
FIG. 14 is a schematic sectional view illustrating a subsequent step in the fabrication of the thyristor epi-film.

First, the GaAs layers 211 to 215 and 302 are etched to form trenches, one of which is shown in FIG. 14. The trenches 225 define the plan geometry of the thin films, and also simplify their removal from the fabrication substrate 324 by enabling the AlAs separation layer to be etched quickly and thoroughly. The trenches 225 are formed by photolithography using, for example, a resist mask patterned to define the trench areas and an etching solution of phosphoric acid and hydrogen peroxide. This solution readily etches the GaAs and AlGaAs layers 211-215 and 302, but the etching rate in (AlGa)InP is slow, so that trench formation halts at the (AlGa)InP etching stop layer 223 and does not proceed into the GaAs buffer layer 222 of the fabrication substrate 324.

After the trenches 225 are formed, the AlAs separation layer 224 is selectively removed by a 10% HF (hydrofluoric acid) solution 325, as shown in FIG. 14. Because the HF etching rate of the AlAs separation layer 224 is much higher than the HF etching rate of the GaAs and AlGaAs layers 211-215 and 302 and the (AlGa)InP etching stop layer 223, the AlAs separation layer 224 can be etched selectively, leaving the thyristor epi-films 306 substantially intact but detaching them from the LED epi-film fabrication substrate 324. FIG. 14 shows an intermediate stage in which the thyristor epi-films 306 are still attached to the fabrication substrate 324 by part of the AlAs separation layer 224. When the etching process is completed, the AlAs separation layer 224 is completely removed and the thyristor epi-films 306 are held from above in, for example, the manner described below.

Before the thyristor epi-films 306 are removed, supporting members may be formed on their surfaces for support and protection. If such supporting members are provided, the thyristor epi-films 306 can be held from above by holding the surfaces of the supporting members with a vacuum holding tool or by attaching a photocurable adhesive sheet of the type that loses its adhesion by exposure to light to the supporting members, an arrangement that makes for easy transportation.

After the AlAs separation layer 224 has been removed by etching, the remaining HF solution is washed away by rinsing in purified water.

Figure 15:
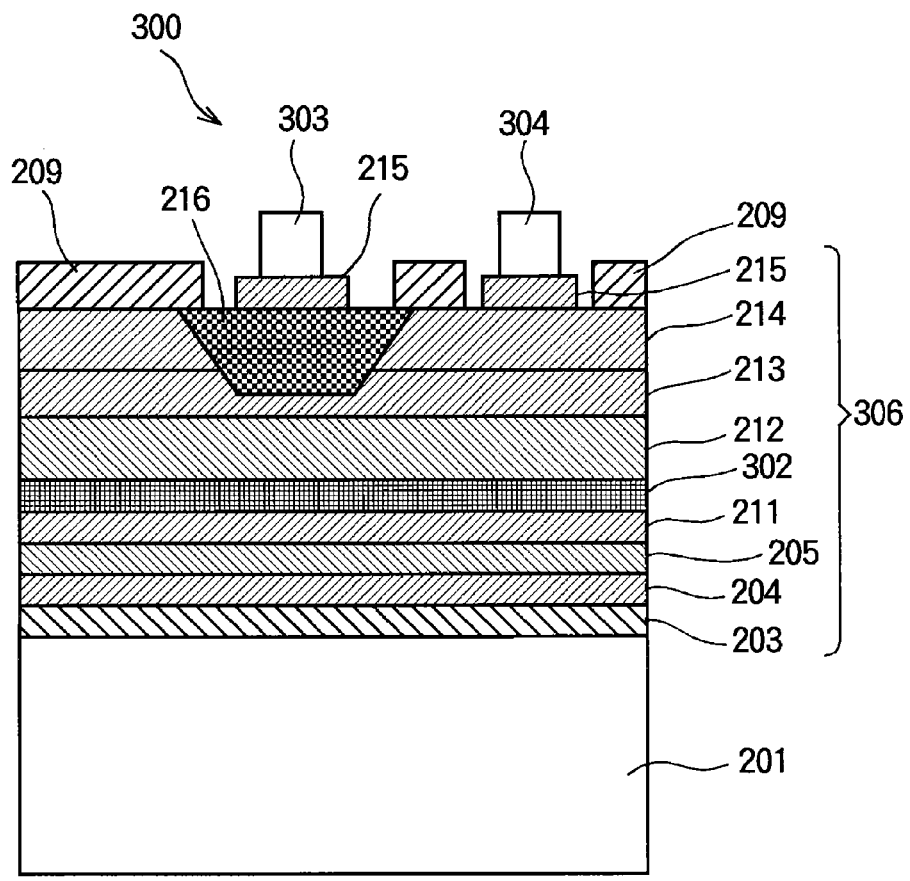
FIG. 15 is a schematic sectional view showing a further step in the fabrication of the thyristor epi-film and illustrating the structure of the combined semiconductor devices in FIGS. 10 to 12.

Referring to FIG. 15, after detachment from the fabrication substrate 324, the thyristor epi-films 306 are transferred to a silicon substrate 201 in which a shift register is formed, the supporting members (if provided) are removed, and well-known steps are carried out to form the zinc diffusion region 216 and complete the structure shown in FIGS. 11 and 12. A detailed description of these steps will be omitted. The silicon substrate 201 is an instance of the substrate 321 indicated in FIGS. 11 and 12. The cross section shown in FIG. 15 comprises, from bottom to top, the silicon substrate 201, a first interlayer dielectric film 203, an adhesive layer 204 such as a polycrystalline silicon layer or an amorphous silicon layer, the conductive ground plane layer 205, a thyristor epi-film 306, a second interlayer dielectric film 209, an anode electrode line 303, and a gate electrode line 304.

Having been fabricated as shown in FIGS. 13 and 14, the thyristor epi-film 306 has a multilayer structure including, from bottom to top, an n-type GaAs lower contact layer 211, a p-type GaAs layer 302, an n-type $Al_xGa_{1-x}As$ lower cladding layer 212 ($0 \leq x \leq 1$), an n-type $Al_yGa_{1-y}As$ active layer 213 ($0 \leq y \leq 1$), an n-type $Al_yGa_{1-x}As$ upper cladding layer 214 ($0 \leq z \leq 1$), and a p-type GaAs upper contact layer 215. After the thyristor epi-film 306 has been transferred to the silicon substrate 201, a p-type zinc diffusion region 216 is formed in the n-type $Al_yGa_{1-y}As$ layer 213 and n-type $Al_zGa_{1-z}As$ layer 214 beneath the GaAs layer 215 connected to the anode electrode line 303 to create a pnpn structure. Light emission takes place at the pn junction between the zinc diffusion region 216 and the n-type part of the active layer 213.

Each thyristor epi-film 306 may include a single light-emitting thyristor, as shown in FIGS. 11 and 12, or an array of light-emitting thyristors, as noted above.

The n-type GaAs layer 211 has a thickness of about 10 nm (=0.01 µm). The p-type GaAs layer 302 has a thickness of about 0.5 µm. The n-type $Al_xGa_{1-x}As$ layer 212 has a thickness of about 0.5 µm. The n-type $Al_yGa_{1-y}As$ layer 213 has a thickness of about 1 µm. The n-type $Al_zGa_{1-z}As$ layer 214 has a thickness of about 0.5 µm. The GaAs layer 215 has a thickness of about 10 nm (=0.01 µm). The LED epi-film 206 accordingly has a thickness of about 2 µm. The thicknesses of the layers are not limited to the values given above.

The aluminum composition ratios of the layers can be selected to satisfy x>y and z>y (for example, x=z=0.4 and y=0.1). The diffusion front of the zinc diffusion region 216 is preferably located in the n-type $Al_yGa_{1-y}As$ active layer 213, to increase the light-emitting area of the pn junction. The cladding layers 212, 214 confine minority carriers injected through the pn junction to the p-type and n-type parts of the active layer. This structure and the overall thinness of the thyristor epi-film 306 (approximately 2 µm), which confers the benefit of low electrical resistance, lead to high light emission efficiency.

Figure 16:
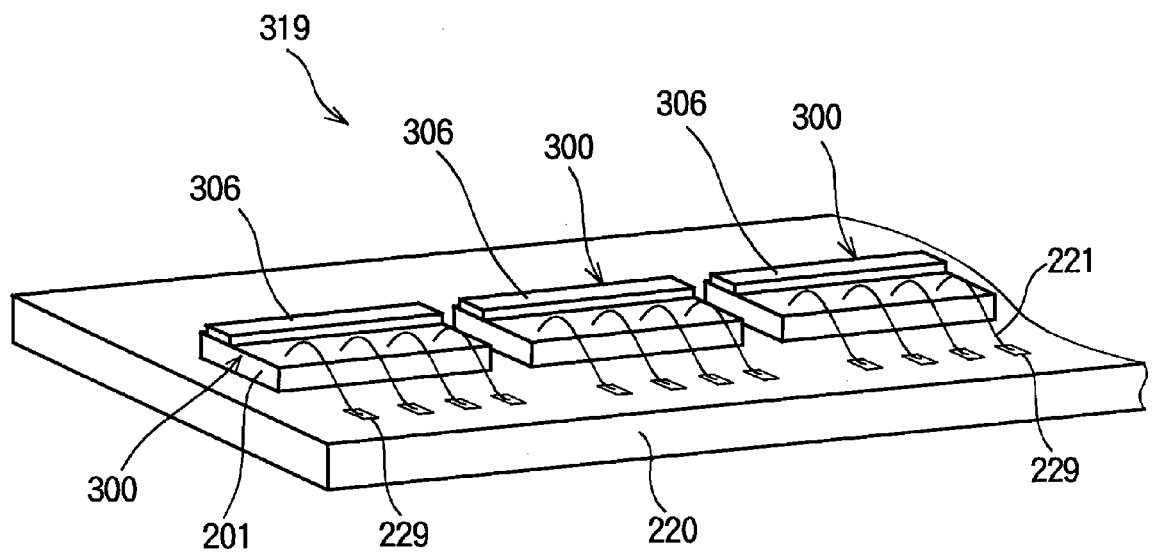
FIG. 16 is a schematic perspective view of a light-emitting thyristor unit formed by mounting combined semiconductor devices of the type shown in FIG. 15 on a printed circuit board.

FIG. 16 is a schematic perspective view of a light-emitting thyristor unit 319 formed by mounting the combined semiconductor devices 300 of the type shown in FIG. 15 on a printed circuit board 220. This light-emitting thyristor unit 319 can be incorporated into a thyristor head with a structure similar to that of the LED head 119 in FIG. 9, and used to replace the LED head 119 in FIG. 1.

As shown in FIG. 16, the plurality of combined semiconductor devices 300 are disposed on the printed circuit board 220 in a linear array with equal spacing. The silicon substrates 201 of the combined semiconductor devices 300 may be bonded onto the printed circuit board 220 by, for example, an insulating adhesive paste or a conductive adhesive paste. The combined semiconductor devices 300 are disposed in such a manner that their thyristor epi-films 306 (or the light-emitting thyristors therein) are arranged in an equally spaced linear array extending the full length of the light-emitting thyristor unit 319. For simplicity, each combined semiconductor device 300 is shown in FIG. 16 as having a single thyristor epi-film 306 (including a plurality of light-emitting thyristors) instead of the multiple thyristor epi-films 306 shown in FIGS. 11 and 12.

Also disposed on the printed circuit board 220 are bonding pads 229 connected by bonding wires 221 to the bonding pads DP, SIP, CKP, and GNDP shown in FIG. 11. Although not shown in FIG. 16, direct bonding wire connections between adjacent data signal bonding pads DP on different combined semiconductor devices 300 may be provided as noted earlier. Alternatively, the connections between adjacent data signal bonding pads DP may be routed through bonding pads 229 and wiring (not shown) on the printed circuit board 220. The shift registers 301 on different combined semiconductor devices 300 may also be interconnected so as to form a single shift register.

Figure 3:
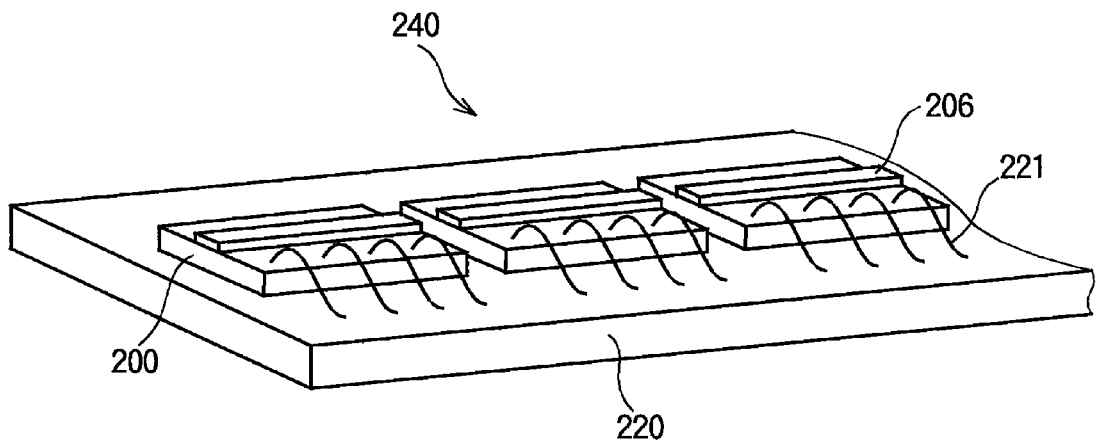
FIG. 3 is a perspective view of an LED unit in another conventional LED head.
Figure 4:
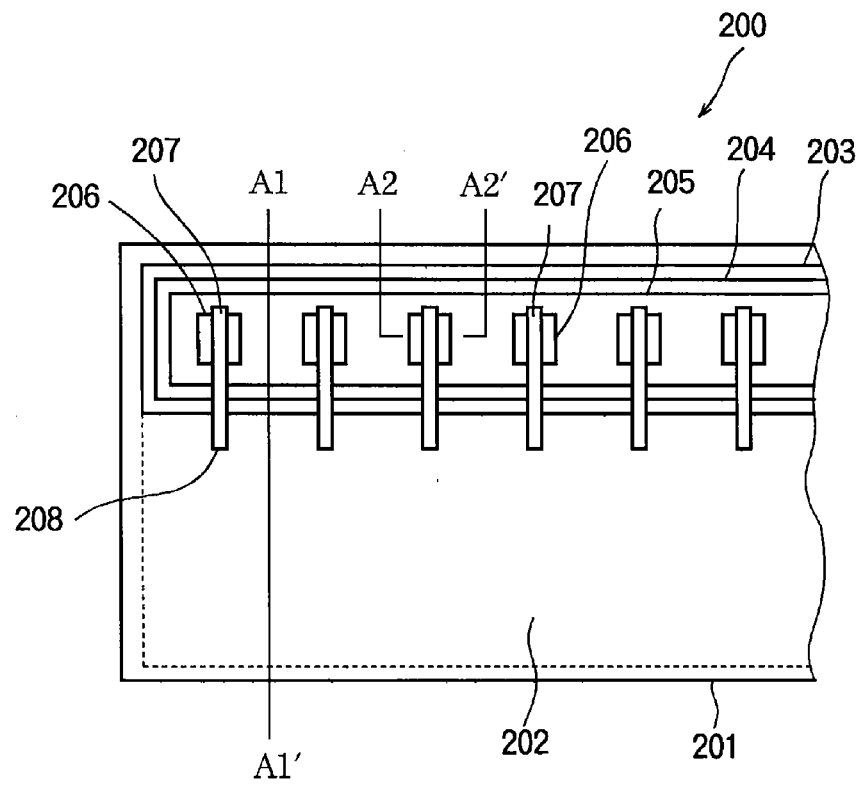
FIG. 4 is a plan view of one of the combined semiconductor chips in FIG. 3.

A feature shared by the combined semiconductor device 300 and the prior art shown in FIGS. 3 and 4 is that no bonding pads are located on the epi-films, which reduces the compound semiconductor material cost of the light-emitting thyristor unit 319 and enables its overall size to be reduced. In particular, the thyristor epi-films 306 do not require mechanical strength to withstand wire bonding, since their electrical connections are provided by the thin-film interconnecting lines 303, 304, and 332, which are formed by photolithography. This enables the thyristor epi-films 306 to be extremely thin, as noted above, with a corresponding reduction in material cost and electrical resistance.

In the combined semiconductor device 300 according to the first embodiment, an adhesive layer 204 formed from a material such as polycrystalline silicon having a high affinity both for the insulating material of the first interlayer dielectric film 203 and the conductive material (a metallic material, for example) of the ground plane 205 is placed between the first interlayer dielectric film 203 and the ground plane 205. This provides strong adhesion between the first interlayer dielectric film 203 and the LED epi-film 206, and improves the reliability of the device.

Figure 17:
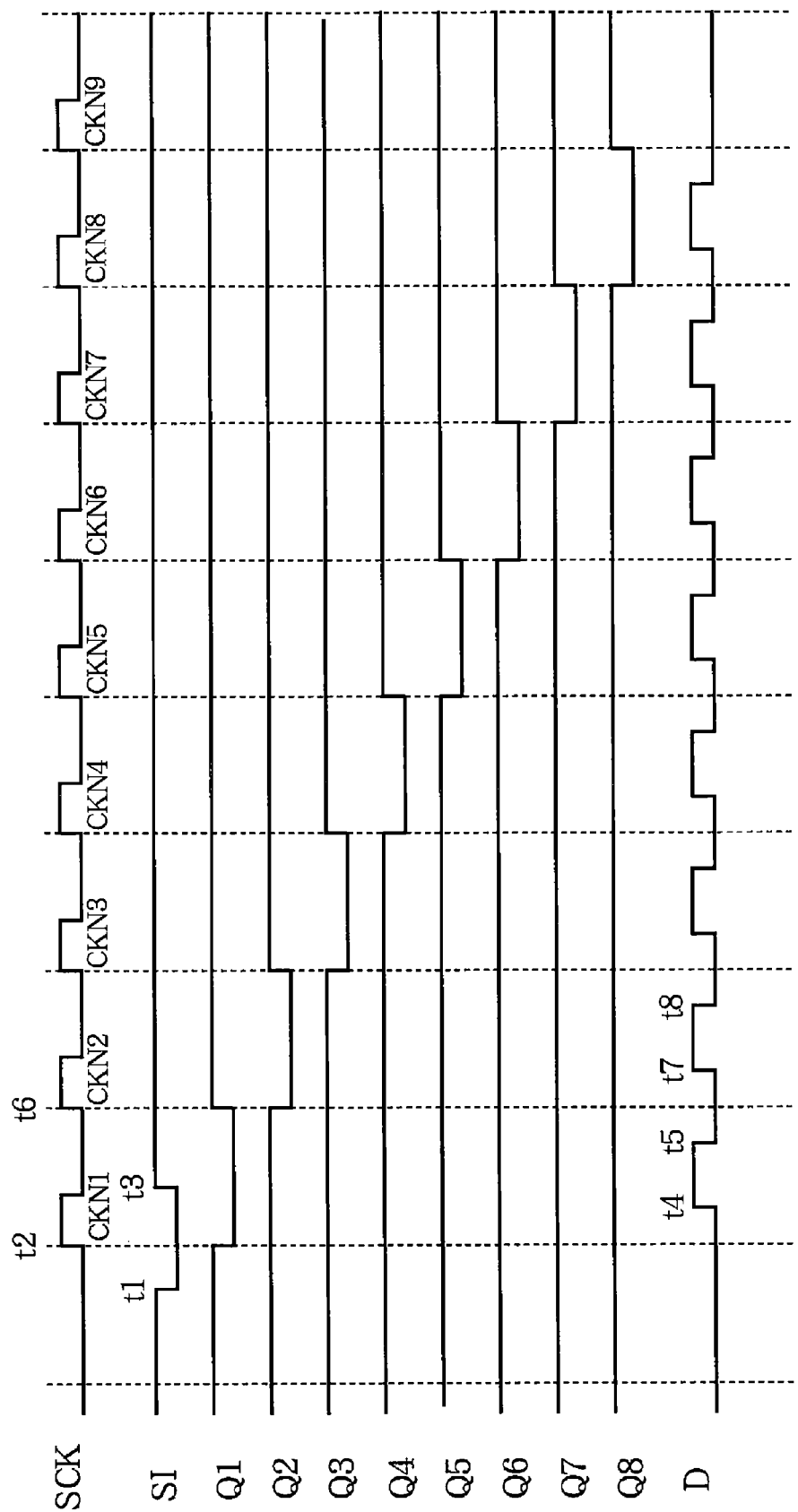
FIG. 17 is a timing waveform diagram illustrating the operation of the combined semiconductor device according to the first embodiment when used in an optical head in an electrophotographic printer.

FIG. 17 is a timing waveform diagram illustrating the operation of the combined semiconductor device according to the first embodiment when used in a thyristor head in an electrophotographic printer. FIG. 17 illustrates the printing of the first eight dots in a single line of dots.

In a preparatory operation (not shown in FIG. 17) that takes place when the printer is powered up, the shift register 301 is preset. Specifically, the shift-in terminal SI is held high while a number of clock pulses equal to the number of shift register stages are input to the clock terminal SCK. This sets all the data output terminals Q1-Q8 of the shift register 301 to the high output level.

To start scanning, the shift-in terminal SI is driven low at time t1. A first pulse (CKN1) of the shift clock signal SCK is input at time t2. At the rising edge of this pulse, the shift-in signal (SI) is latched in the flip-flop circuit of the first stage of the shift register 301, driving its output Q1 to the low logic level and thereby reducing the gate potential of thyristor d1 to the ground level. This output Q1 remains low even after the shift clock SCK returns to the low level and the shift-in terminal SI is driven high again at time t3.

The print data signal at data input signal D goes high at time t4, creating a forward bias between the anode and gate of thyristor d1. This bias generates a trigger current that turns thyristor d1 on. The high print data signal D also creates a forward bias between the anode and cathode of thyristor d1, so current also flows between these electrodes. Most of the light emission is due to the current flow between the anode and cathode. The gate current is comparatively small, because of the small size of the output transistor in the shift register 301.

Thyristor d1 is turned off by reducing the voltage across its anode and cathode to zero. For that purpose, the data signal D is driven low at time t5. A feature of this driving scheme is that the driving circuit 326 inhibits output of light from the thyristors 306 by halting output of their driving current for a prescribed duration before and after the rise of the shift clock SCK, while the shift register 301 is shifting its output signal from one stage to the next.

FIG. 17 illustrates the case in which thyristor d1 is turned on to print a dot. If thyristor d1 does not need to print a dot, the data input signal D is kept low from time t4 to t5 so that thyristor d1 remains off and does not emit light.

At time t6, the shift clock signal SCK goes high again. In the meantime, the shift-in signal SI is kept high. The Q1 output now goes high and the Q2 output goes low.

The data input signal D goes high at time t7, creating a forward bias between the anode and gate of thyristor d2. This generates a trigger current that turns thyristor d2 on, and thyristor d2 emits light until the print data signal D is driven low at time t8.

As indicated in FIG. 17, the low shift-in signal (SI) clocked into the shift register by clock pulse CKN1 is shifted through successive stages of the shift register by the following clock pulses CKN2, CKN3, CKN4, CKN5, CKN6, CKN7, CKN8, causing the shift register outputs Q1, Q2, Q3, Q4, Q5, Q6, Q7, Q8 to go low in turn, one at a time. When the print data signal D goes high, whichever one of thyristors d1-d8 is currently receiving a low shift register output turns on and emits light until the print data signal D goes low again.

The voltage levels of the output signals of the shift register that perform on-off control of the thyristors have a wide tolerance range, so the present invention solves the problem of false illumination caused by deviation of a control voltage from its necessary range, pointed out by Aoki in *Light-Emitting Diodes*. Furthermore, the outputs Q1-Q8 of the shift register 301 do not require a large current driving capability, because the thyristors can be turned on by even a relatively small flow of triggering current at their gate terminals.

The conventional circuit configurations described in *Light-Emitting Diodes* and JP/2004-207444 require a transistor or other switching means having a high current driving capability for each LED, to switch its driving current on and off. A switching means having a high driving capability is a comparatively large semiconductor device, and the need to provide one such device for each LED inevitably results in added cost. Accordingly, with a conventional LED configuration there is a limit to cost reduction.

In the first embodiment, since the light-emitting elements d1-d8 also function as switching elements, there is no need to provide a large number of separate switching means with high current driving capabilities. The device (not shown) that supplies the data signal D needs to be capable of switching a flow of driving current on and off rapidly, as illustrated by the waveform at the bottom of FIG. 17, but only one such driving device is required for the entire array of switching elements, so compared with the conventional configuration, considerable space is saved. In an electrophotographic printer, the size and cost of the optical head can be significantly reduced.

In addition, since only one light-emitting element is driven at a time, much less electrical noise is generated than in conventional schemes that drive multiple light-emitting elements simultaneously.

Although the first embodiment has been described as using light-emitting thyristors, the three-terminal switch array may use switching elements of other types, not necessarily thyristors or and not necessarily light-emitting elements.

In a variation of the first embodiment, the light-emitting thyristors are replaced by light-emitting transistors, which are also three-terminal light-emitting elements. One way to form a light-emitting transistor is to omit the p-type GaAs layer 302 in FIGS. 13 to 15 and interchange the anode and gate connections in FIGS. 11, 12, and 15.

In another variation, the thyristor epi-films 306 are formed from a compound semiconductor material such as $(Al_xGa_{1-x})_yIn_{1-y}P$ ($0 \leq x \leq 1$ and $0 \leq y \leq 1$) instead of aluminum gallium arsenide. In yet another variation, the thyristor epi-films are formed from a nitride compound semiconductor material such as gallium nitride (GaN), aluminum gallium nitride (AlGaN), or indium gallium nitride (InGaN).

In still another variation, the double-hetero multilayer epitaxial structure illustrated in FIGS. 13 to 15 is replaced by a single-hetero multilayer epitaxial structure, or by a homojunction structure formed by creating a diffusion region in a single-layer epitaxial film.

Second Embodiment

The second embodiment adds a gray-scale function to the configuration in the first embodiment.

Figure 18:
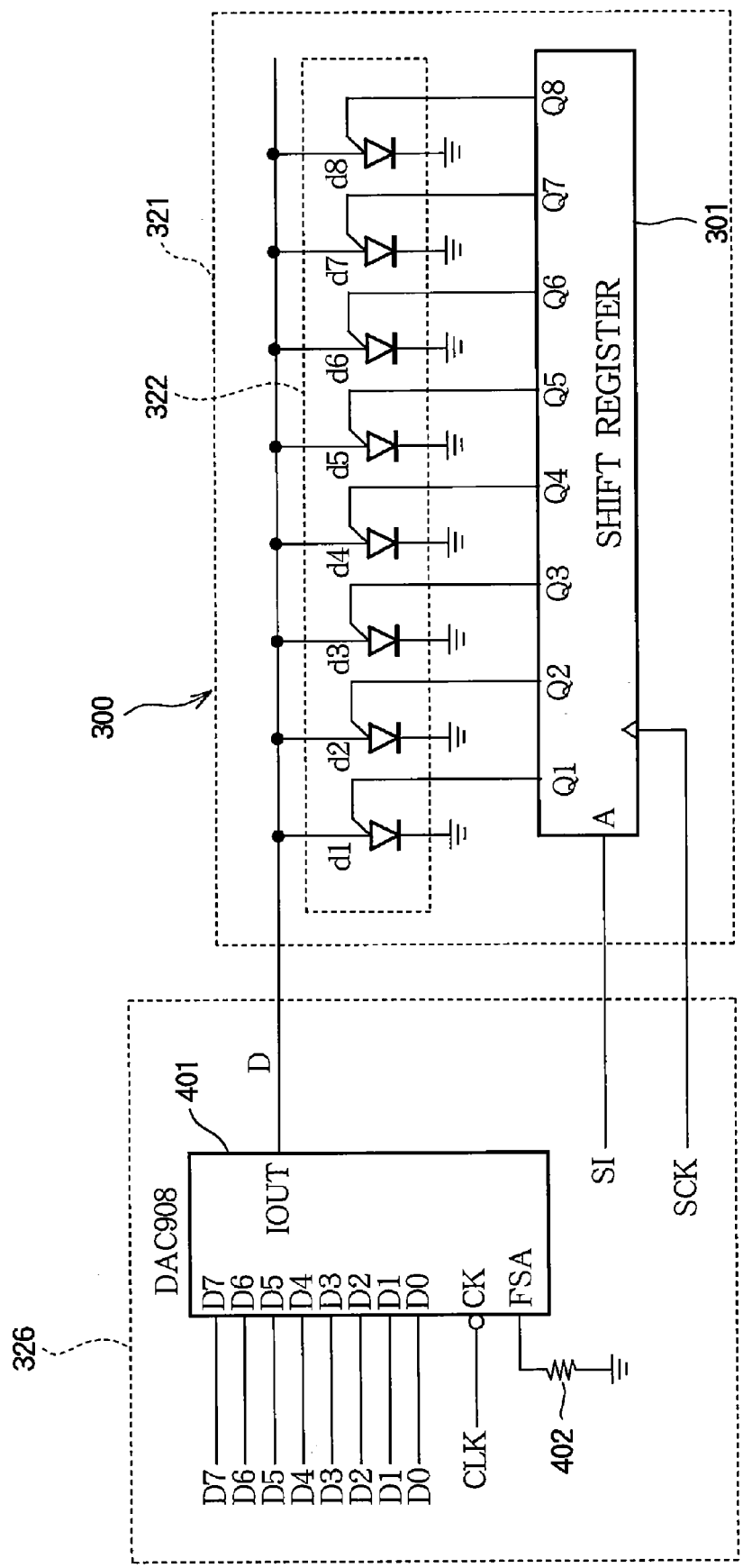
FIG. 18 is a schematic circuit diagram showing a combined semiconductor device according to a second embodiment of the invention connected to a driving circuit in a print control unit.

Referring to the schematic circuit diagram in FIG. 18, the second embodiment includes the combined semiconductor device 300 described in the first embodiment (FIG. 10), and a driving circuit 326. For electrophotographic printing applications, normally there will be an array of combined semiconductor devices 300 mounted on a printed circuit board as in FIG. 16. The driving circuit 326 may form part of the print control unit 101 shown in FIG. 1, for example, or equivalent print control block in an electrophotographic printer.

The driving circuit 326 includes a digital-to-analog (D/A) converter 401 that converts an eight-bit parallel digital input signal (D7-D0) to an analog current value for output from a driving current output terminal IOUT. The output current (D) accordingly has 256 selectable levels. The D/A converter 401 can be any device of the current output type, such as the DAC908 device shown in FIG. 18 as an example, which is manufactured by the Burr-Brown Corporation (now merged with Texas Instruments, U.S.A.).

Data input terminals D7-D0 of the D/A converter 401 are connected to a control circuit in, for example, the print control unit 101 in FIG. 1. The digital data input on signal lines D7-D0 specify the driving energy to be supplied for each printing dot. The clock terminal (CK) of the D/A converter 401 receives a clock signal (CLK) synchronized with the input at data input terminals D7-D0.

The D/A converter 401 has a full-scale adjust (FSA) terminal connected to one end of a resistor 402, the other end of which is connected to ground. The resistance of resistor 402 and a reference voltage value generated in the D/A converter 401 control the maximum driving current output from the driving current output terminal IOUT. The maximum driving current is output when the signal received at data input terminals D7-D0 has its maximum value (decimal '255', hexadecimal 'FF'). When the signal received at data input terminals D7-D0 has a value of zero (hexadecimal '00'), the current output from driving current output terminal IOUT is zero.

The current signal D output from driving current output terminal IOUT of the D/A converter 401 is connected to the anode terminals of light-emitting thyristors d1-d8 in the combined semiconductor device 300. The combined semiconductor device 300 also receives a shift-in signal (SI) and shift clock signal (SCK) as in the first embodiment.

Figure 19:
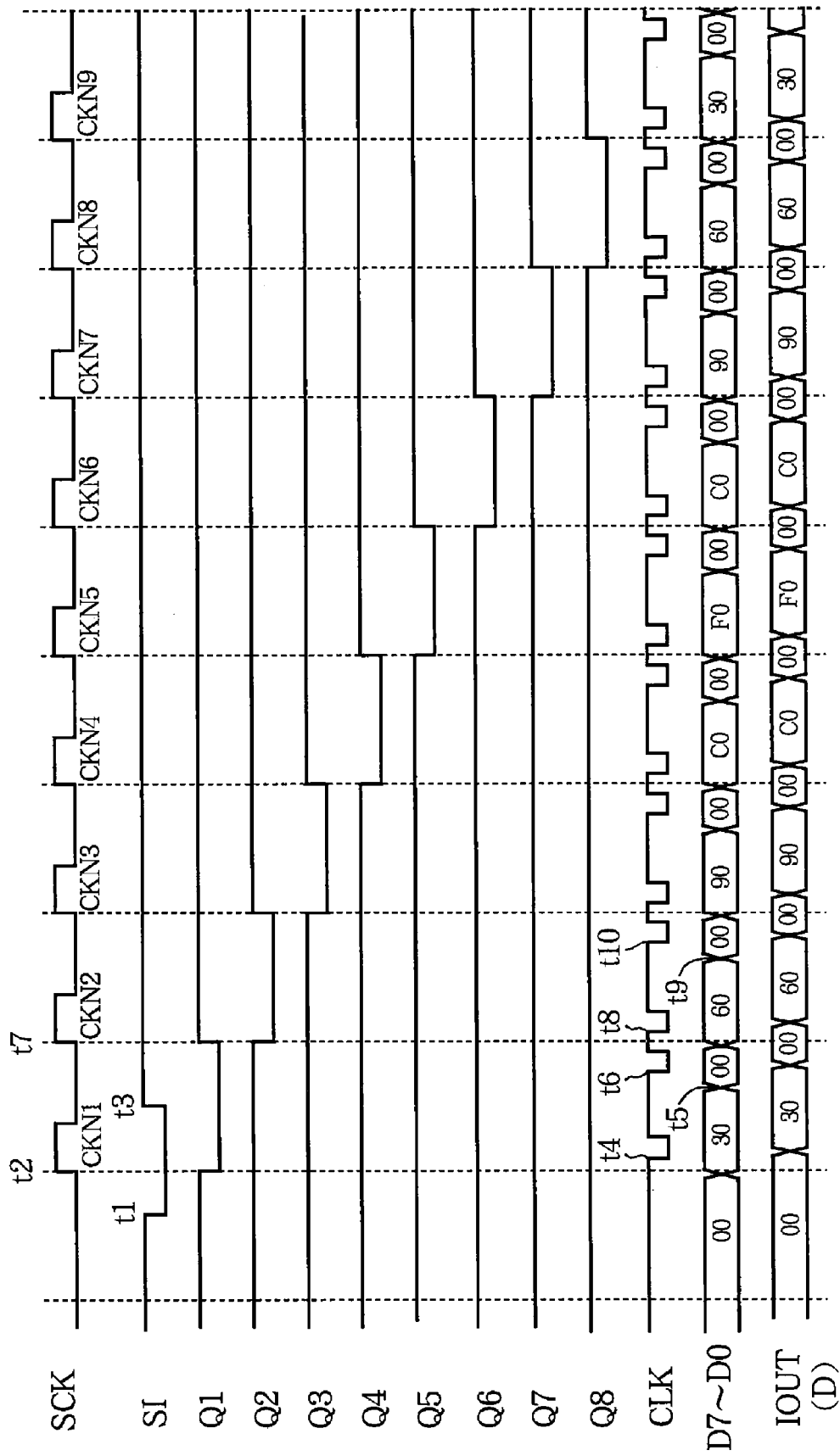
FIG. 19 is a timing waveform diagram illustrating the operation of the device and circuit in FIG. 18 in an electrophotographic printer.

FIG. 19 is a timing waveform diagram illustrating the operation of the combined semiconductor device 300 and driving circuit 326 in an electrophotographic printer. The numeric values of signals D7-D0 are hexadecimal digital data values. The numeric values of the IOUT signal are analog current values, also shown in hexadecimal notation.

FIG. 19 illustrates the scanning of the first eight dots in a single printed line. The intensity (darkness) of the dots increases in regular steps from the hexadecimal '30' level (decimal '48') at the first dot to hexadecimal 'F0' (decimal '240') at the fifth dot, then decreases by similar steps in the succeeding dots.

In a preparatory operation (not shown in FIG. 19) the shift register 301 is preset as described in the first embodiment, so that all the data output terminals (Q1 ...) of the shift register 301 are at the high output level. During this interval the output of the D/A converter 401 is at the zero level, so the thyristors d1-d8 are turned off, their cathodes and anodes both being at the ground level.

To start scanning, the shift-in terminal SI is driven low at time t1, the first pulse (CKN1) of the shift clock signal SCK is input at time t2, and the shift-in terminal SI is driven high again at time t3. As in the first embodiment, the SI signal is latched in the flip-flop circuit of the first stage of the shift register 301 at time t2, causing its output Q1 to go low until the next clock pulse (CKN2).

In synchronization with the rise of the first shift clock pulse (CKN1), hexadecimal '30' is input as data (D7-D0) to the D/A converter 401. Following a short set-up delay, the D/A clock signal CLK goes low at time t4. The fall of this clock signal causes D/A converter 401 to latch its input data '30' and begin output of driving current (D) from its IOUT terminal at a current level proportional to the latched data level '30'.

This current output raises the potential at the IOUT terminal so that trigger current begins to flow between the anode (connected to IOUT) and control or gate terminal (connected to Q1) of thyristor d1. Thyristor d1 now turns on, conducts current between its anode and cathode, and emits light. The amount of light emitted is proportional to the anode current (D), which is proportional to the data value '30'. In the meantime, the D/A clock signal CLK returns to the high level.

At time t5, the data input to the D/A converter 401 revert to zero (hexadecimal '00'). At time t6, following a setup delay, the D/A clock signal CLK is driven low again, causing the D/A converter 401 to latch the '00' data and reset its current output (D) to zero. The anode of thyristor d1 is now at the ground level, so thyristor d1 turns off and light emission ceases.

The next dot is printed in the same way. The second pulse CKN2 of the shift clock SCK is supplied at time t7, shifting the content of the shift register by one stage so that its first output Q1 goes high and its second output Q2 goes low. The data (hexadecimal '60') for the second dot are supplied on signal lines D7-D0 and latched in synchronization with a D/A clock pulse (CLK) at time t8. The D/A converter 401 then outputs current (D) with a value proportional to hexadecimal '60' and thyristor d2 turns on, emitting light with a proportional intensity. The data signals D7-D0 are reset to zero at time t9, then latched in synchronization with another D/A clock pulse at time t10 to reset the driving current (D) to zero, causing thyristor d2 to turn off and stop emitting light.

Subsequent dots are printed in a similar manner in synchronization with shift clock pulses CKN3-CKN9 and corresponding D/A clock pulses. The shift register output (Q9) corresponding to clock pulse CKN9 is not shown.

The second embodiment operates in basically the same way as the first embodiment: a dot line is scanned one dot at a time by a scanning signal shifted through the shift register 301, the illumination of each dot being controlled by a separate data signal (D). The data signal in the second embodiment, however, has two hundred fifty-six levels instead of just two levels. This provides an additional control capability that can be used in two ways.

One use is for halftone or gray-scale printing. Different shades of gray can be printed by adjusting the amounts of emitted light in accordance with the driving current to directly control the size of the printed dots. This scheme can be used instead of conventional dithering schemes that compare dot data with threshold values in, say, a four-by-four dither matrix to obtain a pseudo-gray scale with seventeen levels. Alternatively, dot size control can be combined with dithering to increase the number of gray levels or reduce the size of the matrix. A gray scale with seventeen levels, for example, can be implemented with four output current levels, obtainable from a two-bit D/A converter and a two-by-two dither matrix, which provides better spatial resolution than a four-by-four matrix. In general, the combination of current level control and dithering enables a comparatively large number of gray levels to be represented with a comparatively low-resolution D/A converter and a comparatively small dithering matrix.

Another use of current level control is to compensate for differences in the light emission efficiency of the light-emitting elements, that is, the thyristors. Dot compensation data of the type stored in the memory elements (MEM1 ...) in FIG. 2 can be stored in the driving circuit 326 or elsewhere in the print control unit 101 and used to adjust the data D7-D0 supplied to the D/A converter 401 so that for each intended gray level, all light-emitting elements emit the same amount of light. This compensation scheme greatly improves the yield of the manufacturing process for the combined semiconductor devices 300, since even if process variations lead to noticeable variations in the light emission efficiency of the light-emitting elements in a combined semiconductor device 300, the device need not be discarded as defective. A further factor in the increased yield is that it is only necessary to compensate for variations in the emission efficiency of the light-emitting elements themselves, and not for variations in the electrical characteristics of their driving circuits. This is because all light-emitting elements are driven by current from the same D/A converter 401. The increased yield results in lower cost.

In a variation of the second embodiment, the driving circuit 326 is mounted directly in the optical head, on its printed circuit board 220 (FIG. 16), instead of being located in the print control unit 101 (FIG. 1).

Third Embodiment

In the third embodiment, the light-emitting thyristors are disposed on a side surface of the combined semiconductor device.

Figure 20A:
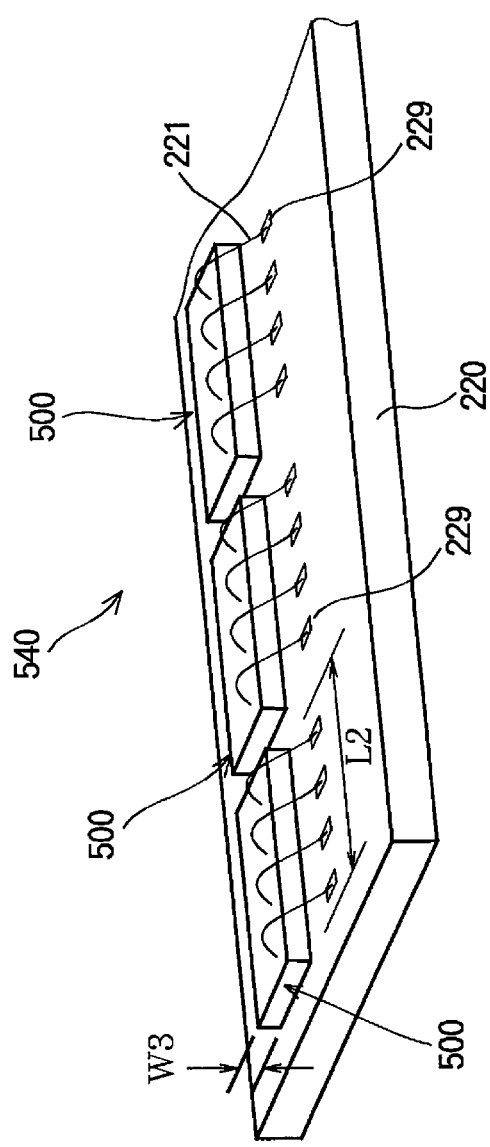
FIGS. 20A and 20B are perspective views showing a light-emitting thyristor unit having combined semiconductor devices according to a third embodiment of the invention.
Figure 20B:
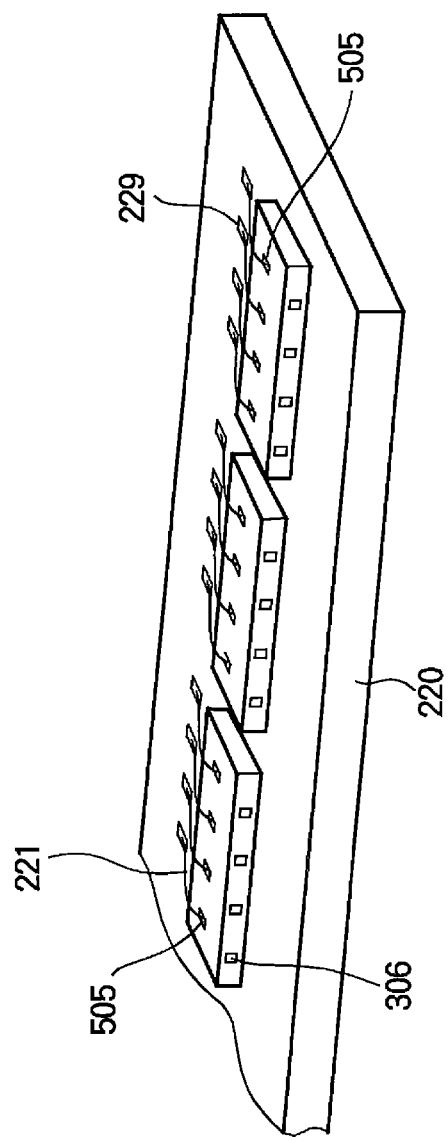

Referring to FIG. 20A, the light-emitting thyristor unit 540 in the third embodiment includes a plurality of combined semiconductor devices 500 mounted on a printed circuit board 220 to which they are electrically coupled via bonding wires 221 and pads 229 as in the preceding embodiments, but no thyristor epi-films are disposed on the upper surfaces of the combined semiconductor devices 500. Instead, the thyristor epi-films 306 are located as shown in FIG. 20B, on side surfaces or edges of the combined semiconductor devices 500. These side surfaces will also be referred to as the first surfaces of the combined semiconductor devices.

As in the preceding embodiments, each combined semiconductor device 500 has a silicon substrate in which a shift register (not shown) is formed, and electrodes or bonding pads 505 on which the bonding wires 221 terminate. The bonding pads 505 are disposed on the upper surface of the combined semiconductor device 500, also referred to below as its second surface. The second surface is, in this embodiment, substantially orthogonal to the first surface. The silicon substrate of the combined semiconductor device 500 is diced from a semiconductor wafer. The second surface is created by the dicing cut. The first surface, although it is a side surface of the combined semiconductor device 500, was part of a major surface of the wafer prior to dicing, and dimension W3 in FIG. 20A is a dimension on that major surface.

Figure 5:
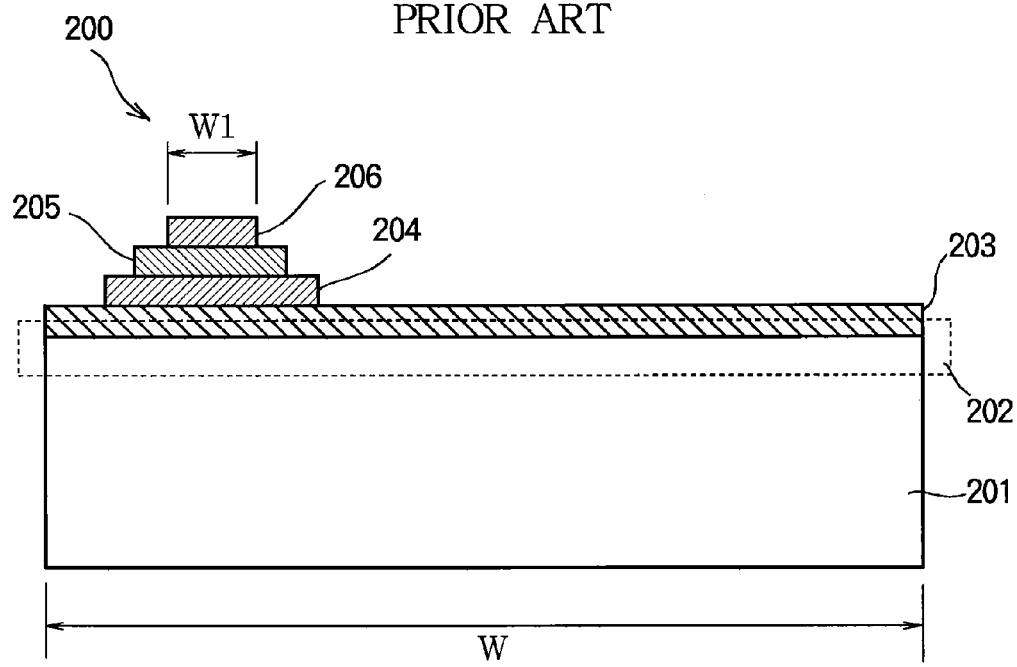
FIG. 5 is a sectional view through line A1-A1' line in FIG. 4.
Figure 6:
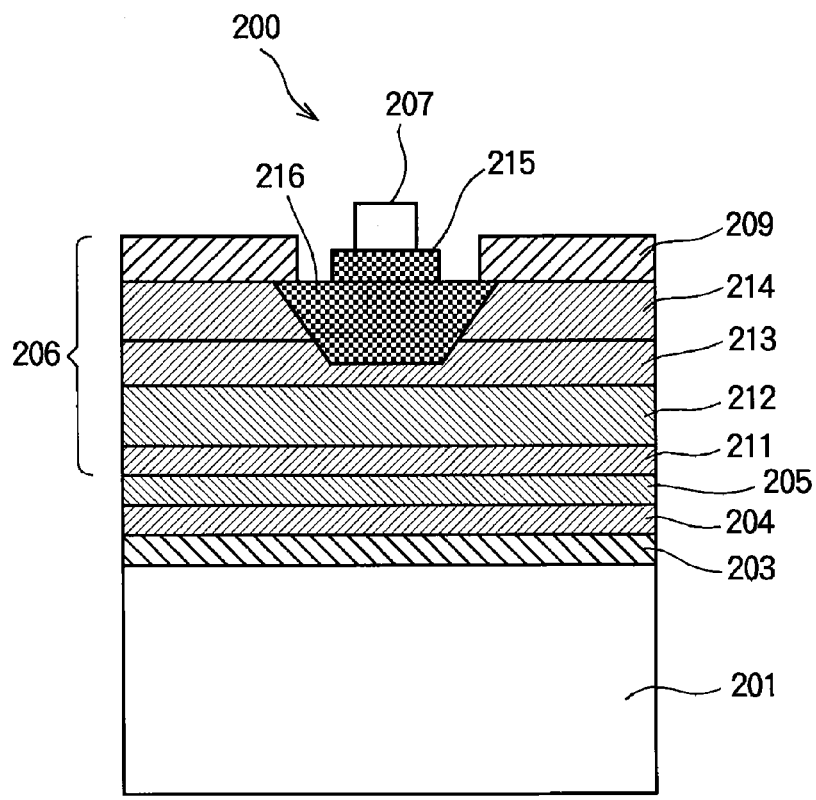
FIG. 6 is a sectional view through line A2-A2' line in FIG. 4.

Since the first surface of the combined semiconductor device 500 only has to accommodate the thyristor epi-films 306 and does not have to accommodate any bonding pads, dimension W3 is much smaller than the width W of the combined semiconductor device 200 in the prior art (FIG. 5) or the width of the combined semiconductor devices in the first and second embodiments. Consequently, many more combined semiconductor devices can be obtained from a single silicon wafer, greatly reducing the fabrication cost of the combined semiconductor devices.

Since the second surface of the combined semiconductor device 500 only has to accommodate the electrodes and bonding pads 505 and does not have to accommodate the thyristor epi-films 306, it too is narrower than the width of the combined semiconductor devices in the prior art and the first and second embodiments, enabling the footprint of the combined semiconductor devices 500 on the printed circuit board 220 to be reduced and thereby enabling the size of the light-emitting thyristor unit 540 to be reduced.

A further advantage of having the thyristor epi-films 306 disposed on a different surface from the surface on which the bonding pads 505 are formed is that the bonding wires 221 cannot interfere with light emitted by the thyristors.

Figure 21:
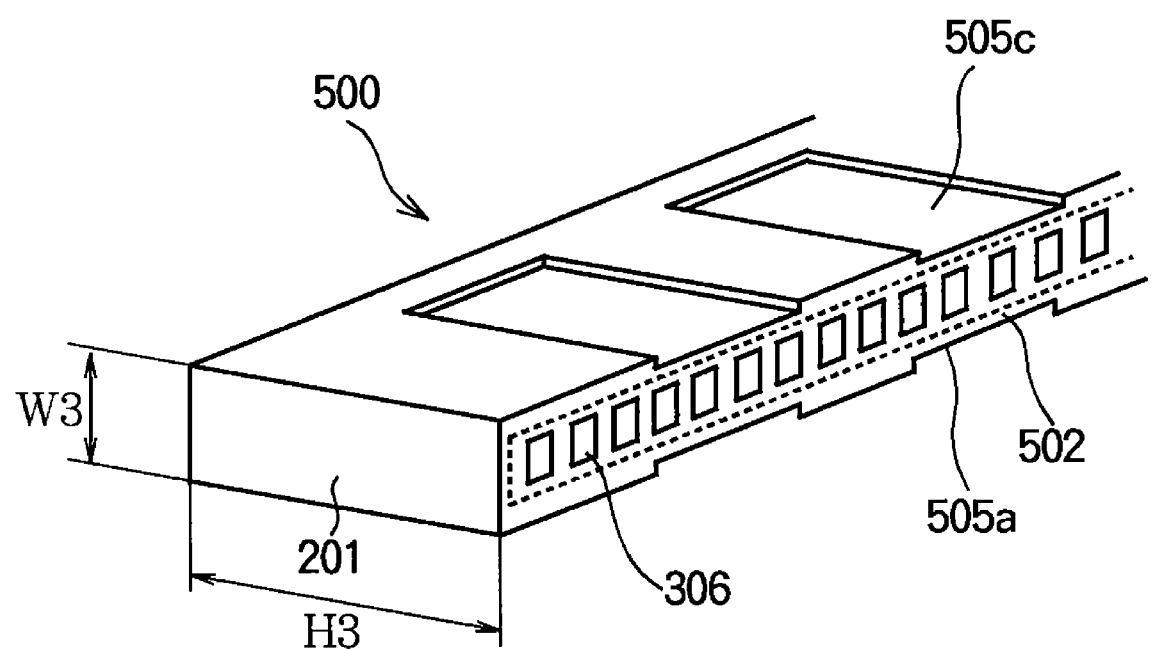
FIG. 21 is a partial perspective view of one of the combined semiconductor devices in FIGS. 20A and 20B.

FIG. 21 shows one of the combined semiconductor devices 500 in more detail, showing the silicon substrate 201, the thyristor epi-films 306, the location of the integrated circuit 502, and pads 505a, 505c which will be described in more detail below. The integrated circuit 502, which is disposed directly behind the thyristor epi-films 306, includes a shift register as in the first and second embodiments. The thyristor epi-films 306 are fabricated as described in the first embodiment. The electrodes 505a, 505c, some of which function as the bonding pads 505 shown in FIG. 20B, provide electrical connections between the integrated circuit 502 and the printed circuit board.

The fabrication of the combined semiconductor devices 500 will now be described with reference to the plan views in FIGS. 22A-25A and the sectional views in FIGS. 22B-25B.

Referring to FIGS. 22A and 22B, integrated circuits 502 including shift registers are formed on a silicon substrate 201, which at this point is a silicon wafer. An interlayer dielectric film 503 is deposited in the surface of the substrate 201, and thyristor epi-films 306 are attached to the dielectric film 503 in linear arrays aligned directly above the integrated circuits 502. Differing from the preceding embodiments, the thyristor epi-films 306 are attached so that the side with the anode and control or gate electrodes (not shown) is in contact with the interlayer dielectric film 503. The control electrodes of the thyristor epi-films 306 are electrically connected to the output terminals of the shift register through holes (not shown) in the interlayer dielectric film 503. The anode electrodes make electrical contact with an anode electrode line (not shown) formed on the surface of the interlayer dielectric film 503.

The dotted lines 501 and 522 in FIG. 22A indicate the boundaries of the individual chips that will be formed when the wafer is diced along the dash-dotted dicing lines 521. The dicing lines 521 are spaced at intervals of L1 and W2 in the length and width directions of the chips. The corresponding length and width dimensions of the chips are L2 and W3. Dimensions L1 and L2 in FIG. 22A are parallel to the longitudinal direction of the thyristor arrays. Dimension W3 is a width dimension on the surface of the wafer, but becomes the height dimension W3 shown in FIG. 20A after the wafer has been diced into discrete chips. The chip length dimension L2 is also shown in FIG. 20A.

Before dicing, the wafer is etched to form holes 504 as shown in FIGS. 23A and 23B, which is a cross section through line A-A' in FIG. 23A. The holes 504 have a rectangular shape defined by well-known photolithographic methods, and are centered on the longitudinal dicing lines 521. Two of the sides 504a, 504c of each hole 504 are located within the chip boundaries and are parallel to the long edges 522 of the chips. The other two sides 504b, 504d cross the longitudinal dicing lines 521 at right angles and have lengths W4 exceeding the spaces between the chips. The depth D1 of the holes 504 is less than the thickness of the silicon substrate 201.

Referring to FIGS. 24A and 24B, which shows a cross section through line A-A' in FIG. 24A, a second interlayer dielectric film 533 is deposited on the surface of the wafer, coating the inner sides of the holes 504. This interlayer dielectric film 533 is partially removed to expose the cathode surfaces of the thyristor epi-films 306. A metal film is then sputtered onto the wafer surface, also coating the inner surfaces of the holes 504. This metal film is patterned by photolithography to expose part of the cathode surfaces of the thyristor epi-films 306, but continues to make electrical contact with the cathode surfaces and thus functions as the cathode electrodes of the thyristors. Other parts of the metal film are patterned to form wiring leading to contact holes (not shown) in the interlayer dielectric films 503, 533 through which electrical contact is made with the integrated circuit 502 to supply power and control signals, including the clock, shift-in, and data signals described in the preceding embodiments. The parts 505a or 505c of the metal film disposed on the sides of the holes 504 located within the chip boundaries function as the bonding pads indicated by reference numeral 505 in FIG. 20B.

As the function of the holes 504 is analogous to the function of through-holes in printed circuit boards in that they provide hollow sites for electrical connections, but the depth of the holes 504 is less than the wafer thickness H3, the holes 504 will also be referred to below as pseudo-through holes. The second interlayer dielectric film 533 and the metal pads 505*a*, 505*c* reduce the width of the pseudo-through holes 504 from W4 to W4*a* as indicated in FIG. 24B.

FIG. 25A and FIG. 25B, which is a cross section through line A-A' in FIG. 25A, show the combined semiconductor devices 500 formed by dicing the wafer into chips. The dicing cuts are made by a rapidly spinning blade coated with diamond particles. The width W5 of the cuts is approximately equal to the width of the blade, and is slightly less than the width W4*a* of the pseudo-through holes.

Each of the combined semiconductor devices 500 diced as shown in FIGS. 25A and 25B has the appearance shown in FIG. 21. The wafer thickness dimension H3 in FIG. 25B becomes the width of the second surface of the combined semiconductor device 500 as indicated in FIG. 21. The chip width dimension W3 in FIG. 25A becomes the height of the first surface of the combined semiconductor device 500 as indicated in FIG. 21. Incidentally, the first surface faces toward the upper left in FIG. 20A, toward the lower left in FIG. 20B, toward the lower right in FIG. 21, and toward the left in FIG. 25B.

The bonding pads denoted by the reference numeral 505 in FIG. 20B correspond to either the pads 505*a* or the pads 505*c* shown in FIGS. 21, 25A, and 25B. The combined semiconductor device 500 can therefore be mounted on the printed circuit board 220 with either side facing up; that is, the second surface of combined semiconductor device 500 may be either the surface with pads 505*a* or the surface with pads 505*c*. Only the pads on the second surface are used for wire bonding.

The third embodiment maximizes the number of combined semiconductor devices 500 that can be manufactured from a single silicon wafer, thereby minimizing the cost of the individual combined semiconductor devices 500.

Figure 9:
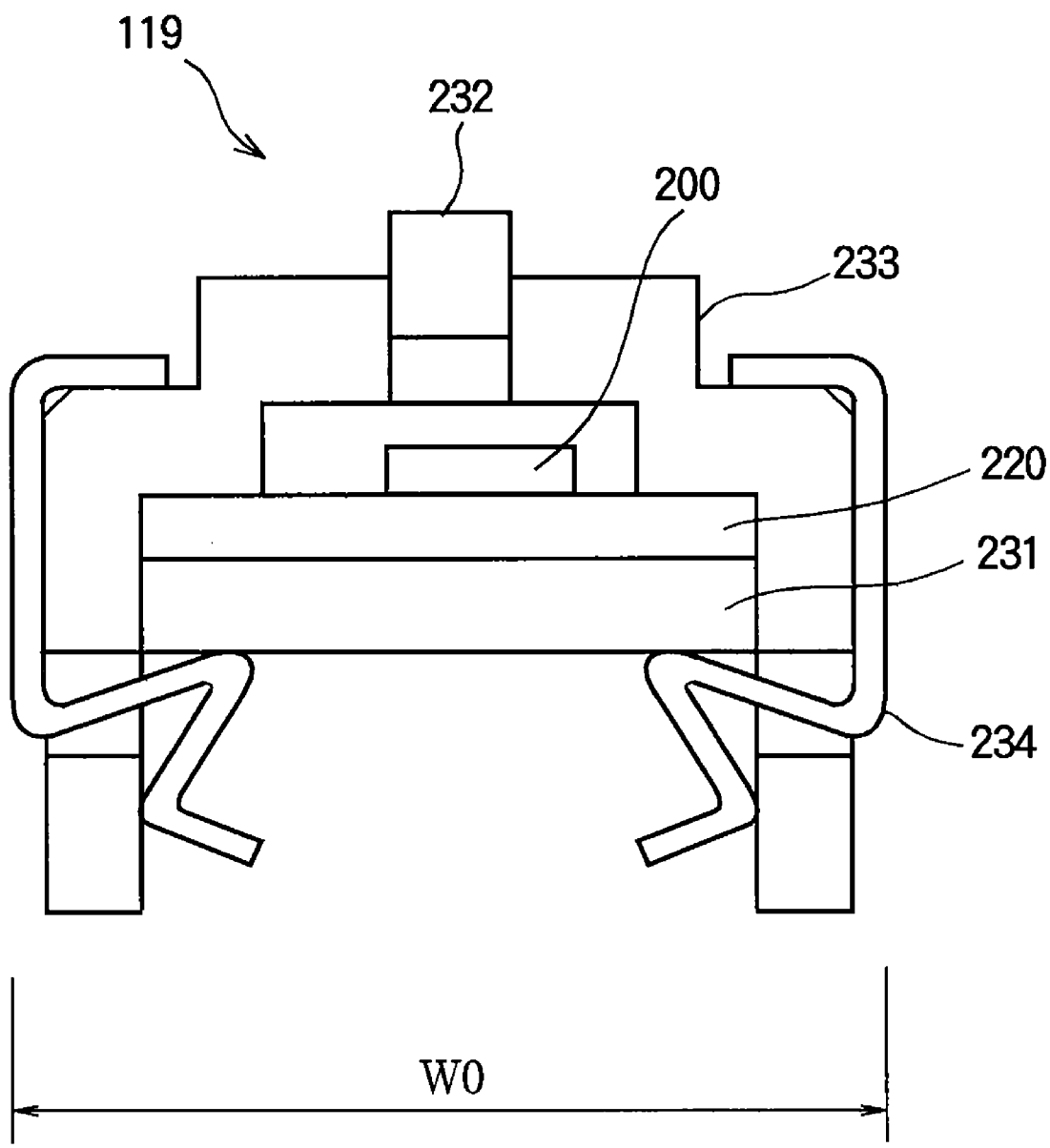
FIG. 9 is a schematic sectional view of a conventional LED head including the LED unit in FIG. 3.
Figure 26:
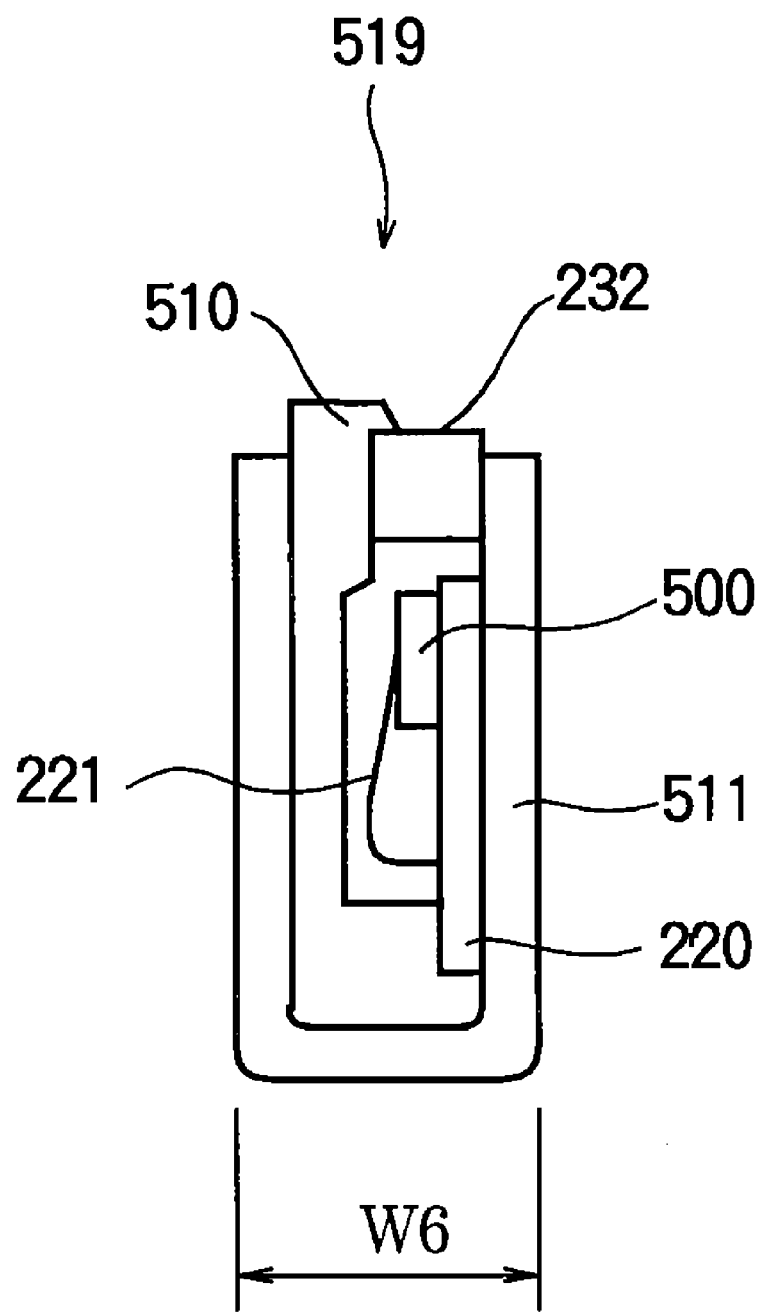
FIG. 26 is a sectional view of a thyristor print head including the thyristor unit in FIGS. 20A and 20B.

FIG. 26 is a sectional view of an optical printing head (thyristor head) 519 including the thyristor unit in FIGS. 20A, 20B, and 21, shown for comparison with the prior art in FIG. 9. The thyristor head 519 comprises a holder 510 that fits inside a U-shaped base 511 to hold the printed circuit board 220 of the thyristor unit and a rod lens array 232. The printed circuit board 220 and rod lens array 232 are held between the holder 510 and one side of the base 511, with space left to accommodate the combined semiconductor devices 500 and bonding wires 221. Light emitted from the first sides of the combined semiconductor devices 500 (the upper sides in FIG. 26) passes through the rod lens array 232 and illuminates the photosensitive drum (not shown) of an electrophotographic printer.

The width W6 of the thyristor head 519 is markedly less than the width W0 of the conventional LED head shown in FIG. 9. The third embodiment has a considerable downsizing effect. The reasons for this effect are that the dimensions of the combined semiconductor devices 500 have been reduced to the minimum necessary to accommodate the bonding pads and thyristor epi-films; that substantially no extra surface area is needed to accommodate the integrated circuits 502 in the combined semiconductor devices 500, since the integrated circuits are lodged behind the array of thyristor epi-films; and that the thyristor epi-films are placed on the sides of the combined semiconductor devices 500 instead of on one of their major surfaces, allowing the longer dimensions of the thyristor unit to be oriented in the plane of the emitted light beams instead of being perpendicular to the light beams.

The effect of the reduced width W6 of the thyristor head in the third embodiment is useful in a monochrome printer, but is particularly valuable in a color printer of the tandem type, having black, yellow, magenta, and cyan printing units with separate photosensitive drums. The reason will become apparent in the next embodiment.

Fourth Embodiment

The fourth embodiment is an image-forming apparatus employing a thyristor head of the type described any of the preceding embodiments.

Figure 27:
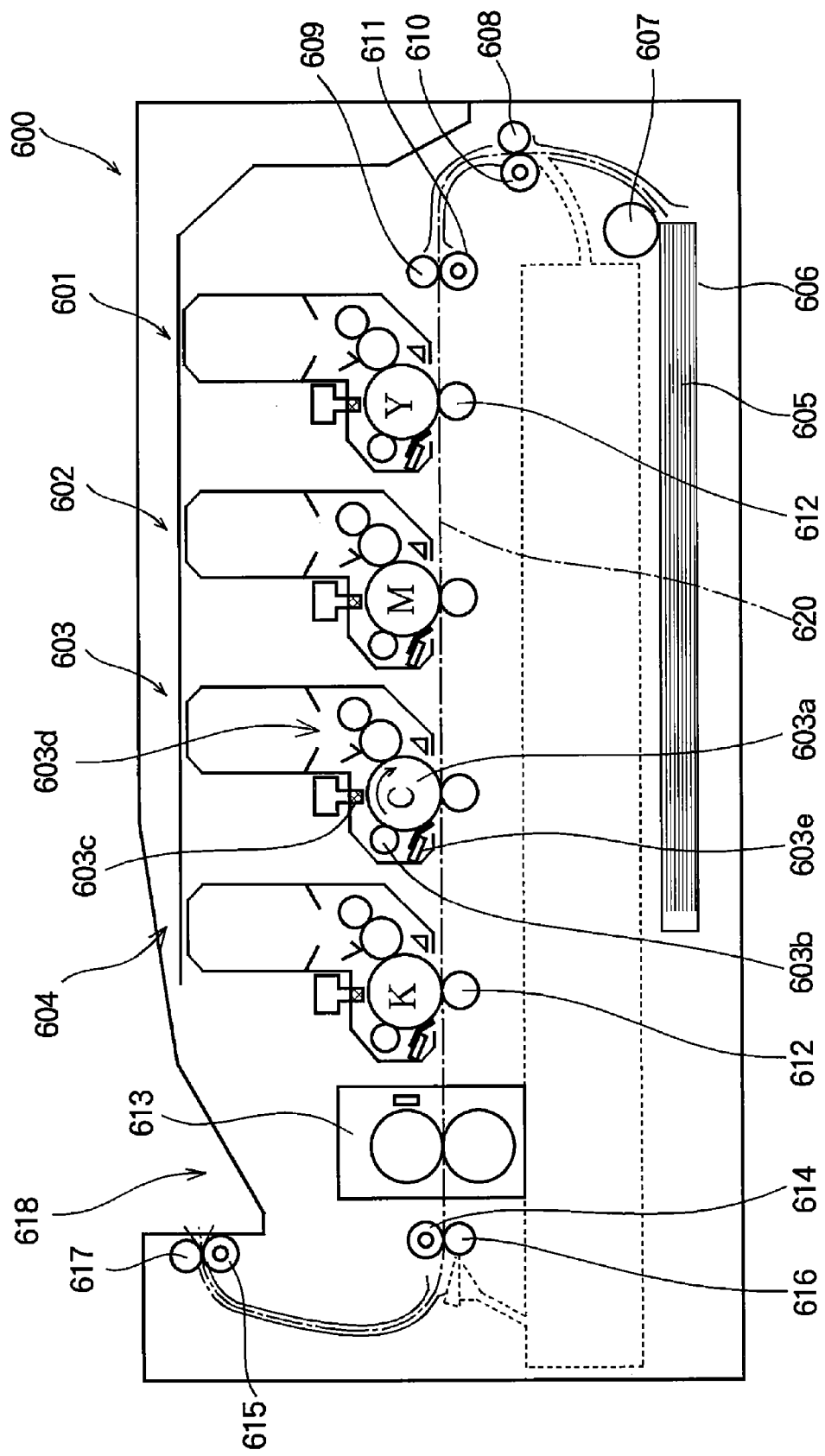
FIG. 27 is a schematic sectional view illustrating an image forming apparatus with thyristor print heads according to the present invention.

Referring to FIG. 27, the image-forming apparatus 600 comprises four process units 601 to 604 that form yellow (Y) magenta (M), cyan (C), and black (K) images, disposed one after another in the downstream direction on the paper transport path. All four process units have the same structure. The cyan process unit 603, for example, includes a photosensitive drum 603*a* that turns in the direction of the arrow, a charging unit 603*b* for charging the surface of the photosensitive drum 603*a*, an exposure unit 603*c* for forming an electrostatic latent image by selectively illuminating the surface of the photosensitive drum 603*a*, a developer unit 603*d* for developing the latent image by applying cyan toner to the surface of the photosensitive drum 603*a*, and a cleaning unit 603*e* for removing toner remaining after the toner image has been transferred from the photosensitive drum 603*a* to paper 605. The thyristor unit or head of the first, second, or third embodiment is used in the exposure unit 603*c*.

A supply of paper 605 (or other recording media) is held in a cassette 606 at the bottom of the image-forming apparatus 600. A hopping roller 607 for picking up individual sheets of paper is disposed above the cassette 606. Sheets of paper 605 picked up by the hopping roller are carried past pinch rollers 608, 609 by a transport roller 610, which feeds the paper downstream, and a registration roller 611, which feeds the paper into the yellow process unit 601 with a short delay that assures that the front edge of the paper is properly aligned. The hopping roller 607, transport roller 610, and registration roller 611 are turned by motor-driven gear mechanisms (not shown).

Below each process unit is a transfer roller 612 formed of semiconductive rubber or a similar material. A voltage applied to the transfer roller 612 provides a potential difference that attracts the toner image from the surface of the photosensitive drum onto the surface of the paper 605.

The paper 605 travels from one process unit to the next, acquiring yellow, magenta, cyan, and black images in turn, then enters a fusing unit 613 having a heating roller and a backup roller that fuse the toner image onto the paper 605 by heat and pressure. After emerging from the fusing unit 613, the paper 605 is ejected from the printer by a pair of delivery rollers 614, 615 that turn against a pair of pinch rollers 616 and 617, and is delivered onto a stacker 618 at the top of the printer. The delivery rollers 614, 615, the rollers in the fusing unit 613, and various rollers and drums in the process units 601 to 604 are also turned by motor-driven gear mechanisms (not shown).

The operation of the image recording apparatus as described above will now be explained.

A single sheet 605 is separated from the top of the stack in the cassette 606 by the hopping roller 607. The paper 605 is transported between the transport roller 610 and its pinch roller 608, then between the registration 611 and its pinch roller 609, then between the photosensitive drum and transfer roller 612 in the yellow process unit 601, where a yellow toner image is formed on its surface. The paper 605 continues on through process units 602, 603, and 604, which add magenta, cyan, and black toner images one after another to build up a full-color image. The full-color image is fused onto the surface of the paper 605 by the fusing unit 613. The paper 605 is then carried between the delivery rollers 614, 615 and their pinch rollers 616 and 617 and delivered onto the stacker 618 at the top of the apparatus 600.

As can be seen from FIG. 27, the exposure unit in each process unit (e.g., the exposure unit 603c in the cyan process unit 603) must fit into the angle between the developer unit (e.g., the cyan developer unit 603d) and the top of the photosensitive drum (e.g., photosensitive drum 603a). The width of the exposure unit thus becomes a critical design constraint; if this width can be reduced, the size of the toner hoppers in the developer units can be increased, which is desirable, or the spacing of the process units and hence the overall length of the printer can be reduced, which is also desirable. The thyristor print heads in the preceding embodiments, and especially the very slim thyristor head 519 in the third embodiment, are highly advantageous in this regard.

The description above has been confined to arrays of light-emitting thyristors used as light sources in an electrophotographic printer, but the present invention can also be applied to an array of thyristors used as switching elements to control voltages applied to other image-forming elements to which they are connected in series, such as organic light-emitting diodes (OLEDs) or other electroluminescent (EL) elements, or heating elements. The present invention can accordingly be usefully employed in a printer having an EL print head or an OLED print head with an array of light-emitting elements, or a thermal printer having a print head with an array of heating elements. The present invention can also be applied to an array of thyristors used as light-emitting display elements or picture elements, or switching elements for driving (controlling the voltage to be applied to) a row or matrix of display elements or picture elements.

The present invention can also be applied to an array of three-terminal elements other than thyristors.

Those skilled in the art will recognize that further variations are possible within the scope of the invention, which is defined in the appended claims.

What is claimed is:

1. A combined semiconductor device comprising:
   a substrate comprised of crystalline silicon, the substrate including a first surface;
   a dielectric film bonded to the first surface of the substrate;
   a three-terminal switch array having a plurality of three-terminal light-emitting switching elements formed from a thin semiconductor film comprised of a compound semiconductor, the three-terminal light-emitting switching elements being arranged in an array from a first three-terminal light-emitting switching element to an N-th three-terminal light-emitting switching element on the first surface of the substrate, N being an integer greater than unity, each three-terminal light-emitting switching element having a first electrode, a second electrode, and a control electrode, and wherein the thin semiconductor film is bonded to the dielectric film such that the dielectric film is between the substrate and the three-terminal switch array;
   a shift register circuit with first to N-th output terminals for output of logic signals, N being an integer greater than unity;
   wherein the shift register circuit is formed in the substrate;
   a driving controller outputting driving current in synchronization with output of the logic signals from the shift register circuit;
   a ground electrode;
   a layer of control electrode wiring formed from a thin film, the control electrode wiring conducting the logic signal from the N-th output of the shift register circuit to the control electrode of the N-th three-terminal light-emitting switching element, for each integer N from one to N, and extending along the first surface of the substrate and a surface of the thin semiconductor film;
   a layer of power-supply wiring formed from a thin film, the power-supply wiring connecting the first electrode of each three-terminal light-emitting switching element to the driving controller, and extending along the first surface of the substrate and the surface of the thin semiconductor film; and
   a layer of ground wiring formed from a thin film, the ground wiring connecting the second electrode of each three-terminal light-emitting switching element to the ground electrode, and extending along the first surface of the substrate and the surface of the thin semiconductor film.

2. The combined semiconductor device of claim 1, wherein the three-terminal light-emitting switching elements are light-emitting thyristors.

3. The combined semiconductor device of claim 1, wherein for a prescribed duration while the shift register outputs the logic signals, the driving controller inhibits output of light from the three-terminal switching elements by halting output of the driving current.

4. A light-emitting element head comprising a plurality of combined semiconductor devices as recited in claim 1 arranged in a row on a printed circuit board.

5. An image forming apparatus comprising the light-emitting element head of claim 4.

6. The combined semiconductor device of claim 1, wherein the shift register is integrated into the first surface of the substrate.

7. A combined semiconductor device comprising:
   a semiconductor substrate comprised of crystalline silicon;
   a dielectric film bonded to a first surface of the semiconductor substrate;
   a shift register circuit formed in the semiconductor substrate, the shift register having a plurality of output terminals;
   a plurality of three-terminal elements formed in a thin semiconductor film comprised of a compound semiconductor bonded to the semiconductor substrate and arranged in a direction parallel to a direction in which the output terminals of the shift register are arranged, each three-terminal element having a first electrode, a second electrode, and a control electrode, the three-terminal elements emitting light by conducting current between their first and second electrodes when switched on by their control electrodes, and wherein the thin semiconductor film is bonded to the dielectric film such that the dielectric film is between the semiconductor substrate and the plurality of three-terminal elements;
   a layer of control electrode wiring formed from a thin film, the control electrode wiring connecting the control electrodes of the three-terminal elements to respective output terminals of the shift register, and extending along the first surface of the semiconductor substrate and a surface of the thin semiconductor film;
   a layer of power-supply wiring formed from a thin film, the power-supply wiring interconnecting the first electrodes of the three-terminal elements, and extending along the first surface of the semiconductor substrate and the surface of the thin semiconductor film; and a layer of ground wiring formed from a thin film, the ground wiring interconnecting the second electrodes of the three-terminal elements, and extending along the first surface of the semiconductor substrate and the surface of the thin semiconductor film.

8. A light-emitting element head comprising a plurality of combined semiconductor devices as recited in claim 7 arranged in a row on a printed circuit board.

9. An image forming apparatus comprising the light-emitting element head of claim 8.

10. A combined semiconductor device comprising:
a substrate comprised of a glass or a ceramic;
a dielectric film bonded to a first surface of the substrate;
a shift register formed in a first thin semiconductor film comprised of polysilicon or an organic semiconductor, and bonded to the substrate, the shift register having a plurality of output terminals;
a plurality of three-terminal elements formed in a second thin semiconductor film bonded to the dielectric film such that the dielectric film is between the substrate and the plurality of three-terminal elements, and arranged in a direction parallel to a direction in which the output terminals of the shift register are arranged, each three-terminal element having a first electrode, a second electrode, and a control electrode, the light-emitting elements emitting light by conducting current between their first and second electrodes when switched on by their control electrodes, the second thin semiconductor film comprised of a compound semiconductor;
a layer of control electrode wiring formed from a thin film, the control electrode wiring connecting the control electrodes of the three-terminal elements to respective output terminals of the shift register, and extending along surfaces of the first and second thin semiconductor films;
a layer of power-supply wiring formed from a thin film, the power-supply wiring interconnecting the first electrodes of the three-terminal elements, and extending along the surfaces of the first and second thin semiconductor films; and
a layer of ground wiring formed from a thin film, the ground wiring interconnecting the second electrodes of the three-terminal elements, and extending along the surfaces of the first and second thin semiconductor films.

11. A light-emitting element head comprising a plurality of combined semiconductor devices as recited in claim 10 arranged in a row on a printed circuit board.

12. An image forming apparatus comprising the light-emitting element head of claim 11.

13. A combined semiconductor device comprising:
a semiconductor chip formed from a crystalline silicon, having a first surface and a second surface orthogonal to the first surface;
a dielectric film bonded to the first surface;
a light-emitting semiconductor device formed from a thin film of a compound semiconductor, the thin film being bonded to the dielectric film such that the dielectric film is between the semiconductor chip and the light-emitting semiconductor device;
circuitry connected to the light-emitting semiconductor device, wherein the circuitry comprises a shift register formed in the semiconductor chip; and
a plurality of bonding pads disposed on the second surface of the semiconductor chip, connected selectively to the light-emitting semiconductor device and the circuitry.

14. A light-emitting element head comprising a plurality of combined semiconductor devices as recited in claim 13 arranged in a row on a printed circuit board.

15. An image forming apparatus comprising the light-emitting element head of claim 14.

* * * * *